(12) United States Patent
Holden et al.

(10) Patent No.: US 8,999,816 B1
(45) Date of Patent: Apr. 7, 2015

(54) PRE-PATTERNED DRY LAMINATE MASK FOR WAFER DICING PROCESSES

(71) Applicants: James M. Holden, San Jose, CA (US);
Aparna Iyer, Sunnyvale, CA (US);
Brad Eaton, Menlo Park, CA (US);
Ajay Kumar, Cupertino, CA (US)

(72) Inventors: James M. Holden, San Jose, CA (US);
Aparna Iyer, Sunnyvale, CA (US);
Brad Eaton, Menlo Park, CA (US);
Ajay Kumar, Cupertino, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 14/256,429

(22) Filed: Apr. 18, 2014

(51) Int. Cl.
*H01L 21/00* (2006.01)
*H01L 21/78* (2006.01)

(52) U.S. Cl.
CPC .................................. *H01L 21/78* (2013.01)

(58) Field of Classification Search
USPC ............. 438/462, 33, 68, 113, 114, 460, 463, 438/465
See application file for complete search history.

(56) References Cited

U.S. PATENT DOCUMENTS

| | | |
|---|---|---|
| 4,049,944 A | 9/1977 | Garvin et al. |
| 4,339,528 A | 7/1982 | Goldman |
| 4,684,437 A | 8/1987 | Donelon et al. |
| 5,336,638 A | 8/1994 | Suzuki et al. |
| 5,593,606 A | 1/1997 | Owen et al. |
| 5,691,794 A | 11/1997 | Hoshi et al. |
| 6,051,503 A | 4/2000 | Bhardwaj et al. |
| 6,057,180 A | 5/2000 | Sun et al. |
| 6,174,271 B1 | 1/2001 | Kosmowski |
| 6,300,593 B1 | 10/2001 | Powell |
| 6,306,731 B1 | 10/2001 | Igarashi et al. |
| 6,407,363 B2 | 6/2002 | Dunsky et al. |
| 6,426,275 B1 | 7/2002 | Arisa |
| 6,465,158 B1 | 10/2002 | Sekiya |
| 6,528,864 B1 | 3/2003 | Arai |
| 6,574,250 B2 | 6/2003 | Sun et al. |
| 6,582,983 B1 | 6/2003 | Runyon et al. |
| 6,593,542 B2 | 7/2003 | Baird et al. |
| 6,642,127 B2 | 11/2003 | Kumar et al. |
| 6,676,878 B2 | 1/2004 | O'Brien et al. |
| 6,696,669 B2 | 2/2004 | Hembree et al. |

(Continued)

FOREIGN PATENT DOCUMENTS

| | | |
|---|---|---|
| JP | 9216085 | 8/1997 |
| JP | 10321908 | 12/1998 |

(Continued)

OTHER PUBLICATIONS

Linder, V. et al., "Water-Soluble Sacrificial Layers for Surface Micromachining", www.small-journal.com, 2005, 1, No. 7, 7 pgs.

(Continued)

*Primary Examiner* — Timor Karimy
(74) *Attorney, Agent, or Firm* — Blakely Sokoloff Taylor Zafman LLP

(57) ABSTRACT

Approaches for protecting a wafer during plasma etching wafer dicing processes are described. In an example, a method of dicing a semiconductor wafer with a front surface having a plurality of integrated circuits thereon involves laminating a pre-patterned mask on the front surface of the semiconductor wafer. The pre-patterned mask covers the integrated circuits and exposes streets between the integrated circuits. The method also involves plasma etching the semiconductor wafer through the streets to singulate the integrated circuits. The pre-patterned mask protects the integrated circuits during the plasma etching.

19 Claims, 16 Drawing Sheets

(56) References Cited

U.S. PATENT DOCUMENTS

| | | | |
|---|---|---|---|
| 6,706,998 B2 | 3/2004 | Cutler | |
| 6,759,275 B1 | 7/2004 | Lee et al. | |
| 6,803,247 B2 | 10/2004 | Sekiya | |
| 6,887,804 B2 | 5/2005 | Sun et al. | |
| 6,998,571 B2 | 2/2006 | Sekiya et al. | |
| 7,128,806 B2 | 10/2006 | Nguyen et al. | |
| 7,129,150 B2 | 10/2006 | Kawai | |
| 7,179,723 B2 | 2/2007 | Genda et al. | |
| 7,265,033 B2 | 9/2007 | Shigematsu et al. | |
| 7,361,990 B2 | 4/2008 | Lu et al. | |
| 7,364,986 B2 | 4/2008 | Nagai et al. | |
| 7,435,607 B2 | 10/2008 | Nagai | |
| 7,459,377 B2 | 12/2008 | Ueda et al. | |
| 7,468,309 B2 | 12/2008 | Shigematsu et al. | |
| 7,473,866 B2 | 1/2009 | Morishige et al. | |
| 7,507,638 B2 | 3/2009 | Mancini et al. | |
| 7,507,639 B2 | 3/2009 | Nakamura | |
| 7,629,228 B2 | 12/2009 | Haji et al. | |
| 7,678,670 B2 | 3/2010 | Arita et al. | |
| 7,687,740 B2 | 3/2010 | Bruland et al. | |
| 7,754,584 B2 | 7/2010 | Kumakawa | |
| 7,767,551 B2 | 8/2010 | Arita et al. | |
| 7,767,554 B2 | 8/2010 | Arita et al. | |
| 7,776,720 B2 | 8/2010 | Boyle et al. | |
| 7,804,043 B2 | 9/2010 | Deshi | |
| 7,838,323 B2 | 11/2010 | Utsumi et al. | |
| 7,859,084 B2 | 12/2010 | Utsumi et al. | |
| 7,875,898 B2 | 1/2011 | Maeda | |
| 7,906,410 B2 | 3/2011 | Arita et al. | |
| 7,923,351 B2 | 4/2011 | Arita | |
| 7,926,410 B2 | 4/2011 | Bair | |
| 7,927,973 B2 | 4/2011 | Haji et al. | |
| 2003/0162313 A1 | 8/2003 | Kim et al. | |
| 2004/0080045 A1 | 4/2004 | Kimura et al. | |
| 2004/0137700 A1 | 7/2004 | Sekiya | |
| 2004/0157457 A1 | 8/2004 | Xu et al. | |
| 2004/0212047 A1 | 10/2004 | Joshi et al. | |
| 2006/0043535 A1 | 3/2006 | Hiatt | |
| 2006/0086898 A1 | 4/2006 | Cheng et al. | |
| 2006/0088984 A1 | 4/2006 | Li et al. | |
| 2006/0146910 A1 | 7/2006 | Koochesfahani et al. | |
| 2006/0205182 A1 | 9/2006 | Soejima | |
| 2007/0072321 A1* | 3/2007 | Sherrer et al. | 438/26 |
| 2009/0255911 A1 | 10/2009 | Krishnaswami et al. | |
| 2010/0013036 A1 | 1/2010 | Carey | |
| 2010/0248451 A1 | 9/2010 | Pirogovsky et al. | |
| 2011/0312157 A1* | 12/2011 | Lei et al. | 438/462 |
| 2013/0045554 A1 | 2/2013 | Yamazaki | |
| 2013/0065378 A1 | 3/2013 | Johnson et al. | |
| 2013/0230972 A1 | 9/2013 | Johnson et al. | |

FOREIGN PATENT DOCUMENTS

| | | |
|---|---|---|
| JP | 2001127011 | 5/2001 |
| JP | 2001144126 | 5/2001 |
| JP | 2003179005 | 6/2003 |
| JP | 2004031526 | 1/2004 |
| JP | 2004055684 | 2/2004 |
| WO | WO-03036712 | 5/2003 |
| WO | WO-03071591 | 5/2003 |

OTHER PUBLICATIONS

Singh, Saravjeet et al., "Apparatus and Methods for Dry Etch With Edge, Side and Back Protection", U.S. Appl. No. 61/491,693, filed May 31, 2011 24 pgs.

Lei, et al., U.S. Appl. No. 14/060,005 entitled "Maskless Hybrid Laser Scribing and Plasma Etching Wafer Dicing Process", filed Oct. 22, 2013, 49 pgs.

Lei, et al., U.S. Appl. No. 13/947,890 entitled "Wafer Dicing With Wide Kerf by Laser Scribing and Plasma Etching Hybrid Approach", filed Jul. 22, 2013, 49 pgs.

Holden, et al., U.S. Appl. No. 14/201,452 entitled "Approaches for Cleaning a Wafer During Hybrid Laser Scribing and Plasma Etching Wafer Dicing Processes", filed Mar. 7, 2014, 60 pgs.

* cited by examiner

PRE-PATTERNED DRY LAMINATE MASK FOR WAFER DICING PROCESSES

BACKGROUND

1) Field

Embodiments of the present invention pertain to the field of semiconductor processing and, in particular, to methods of dicing semiconductor wafers, each wafer having a plurality of integrated circuits thereon.

2) Description of Related Art

In semiconductor wafer processing, integrated circuits are formed on a wafer (also referred to as a substrate) composed of silicon or other semiconductor material. In general, layers of various materials which are either semiconducting, conducting or insulating are utilized to form the integrated circuits. These materials are doped, deposited and etched using various well-known processes to form integrated circuits. Each wafer is processed to form a large number of individual regions containing integrated circuits known as dice.

Following the integrated circuit formation process, the wafer is "diced" to separate the individual die from one another for packaging or for use in an unpackaged form within larger circuits. The two main techniques that are used for wafer dicing are scribing and sawing. With scribing, a diamond tipped scribe is moved across the wafer surface along pre-formed scribe lines. These scribe lines extend along the spaces between the dice. These spaces are commonly referred to as "streets." The diamond scribe forms shallow scratches in the wafer surface along the streets. Upon the application of pressure, such as with a roller, the wafer separates along the scribe lines. The breaks in the wafer follow the crystal lattice structure of the wafer substrate. Scribing can be used for wafers that are about 10 mils (thousandths of an inch) or less in thickness. For thicker wafers, sawing is presently the preferred method for dicing.

With sawing, a diamond tipped saw rotating at high revolutions per minute contacts the wafer surface and saws the wafer along the streets. The wafer is mounted on a supporting member such as an adhesive film stretched across a film frame and the saw is repeatedly applied to both the vertical and horizontal streets. One problem with either scribing or sawing is that chips and gouges can form along the severed edges of the dice. In addition, cracks can form and propagate from the edges of the dice into the substrate and render the integrated circuit inoperative. Chipping and cracking are particularly a problem with scribing because only one side of a square or rectangular die can be scribed in the <110> direction of the crystalline structure. Consequently, cleaving of the other side of the die results in a jagged separation line. Because of chipping and cracking, additional spacing is required between the dice on the wafer to prevent damage to the integrated circuits, e.g., the chips and cracks are maintained at a distance from the actual integrated circuits. As a result of the spacing requirements, not as many dice can be formed on a standard sized wafer and wafer real estate that could otherwise be used for circuitry is wasted. The use of a saw exacerbates the waste of real estate on a semiconductor wafer. The blade of the saw is approximate 15 microns thick. As such, to insure that cracking and other damage surrounding the cut made by the saw does not harm the integrated circuits, three to five hundred microns often must separate the circuitry of each of the dice. Furthermore, after cutting, each die requires substantial cleaning to remove particles and other contaminants that result from the sawing process.

Plasma dicing has also been used, but may have limitations as well. For example, one limitation hampering implementation of plasma dicing may be cost. A standard lithography operation for patterning resist may render implementation cost prohibitive. Another limitation possibly hampering implementation of plasma dicing is that plasma processing of commonly encountered metals (e.g., copper) in dicing along streets can create production issues or throughput limits.

SUMMARY

One or more embodiments described herein are directed to approaches for protecting a wafer during plasma etching wafer dicing processes.

In an embodiment, a method of dicing a semiconductor wafer with a front surface having a plurality of integrated circuits thereon involves laminating a pre-patterned mask on the front surface of the semiconductor wafer. The pre-patterned mask covers the integrated circuits and exposes streets between the integrated circuits. The method also involves plasma etching the semiconductor wafer through the streets to singulate the integrated circuits. The pre-patterned mask protects the integrated circuits during the plasma etching.

In another embodiment, a method of dicing a semiconductor wafer with a front surface having a plurality of integrated circuits thereon involves laminating a pre-patterned mask on the front surface of the semiconductor wafer. The pre-patterned mask covers the integrated circuits and exposes streets between the integrated circuits. The method also involves laser scribing the streets to provide scribe lines between the integrated circuits. The method also involves plasma etching the semiconductor wafer through the scribe lines to singulate the integrated circuits. The pre-patterned mask protects the integrated circuits during the plasma etching.

In another embodiment, a method of dicing a semiconductor wafer with a front surface having a plurality of integrated circuits thereon involves forming a pre-patterned underfill material layer between and covering metal pillar/solder bump pairs of the integrated circuits. The pre-patterned underfill material layer exposes streets between the integrated circuits. The method also involves plasma etching the semiconductor wafer through the streets to singulate the integrated circuits. The pre-patterned underfill material layer protects the integrated circuits during the plasma etching. The method also involves, subsequent to the plasma etching, thinning but not removing the pre-patterned underfill material layer to partially expose the metal pillar/solder bump pairs of the integrated circuits.

DETAILED DESCRIPTION

Figure 1A:
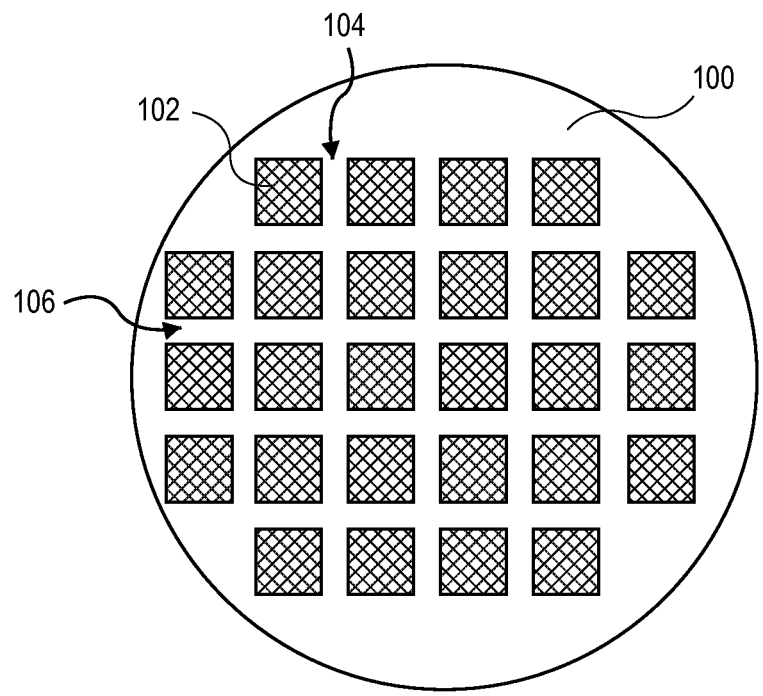
FIG. 1A illustrates a top plan of a semiconductor wafer to be diced.

Approaches for protecting a wafer during plasma etching wafer dicing processes are described. In the following description, numerous specific details are set forth, such as laser scribing and plasma etching conditions and material regimes, in order to provide a thorough understanding of embodiments of the present invention. It will be apparent to one skilled in the art that embodiments of the present invention may be practiced without these specific details. In other instances, well-known aspects, such as integrated circuit fabrication, are not described in detail in order to not unnecessarily obscure embodiments of the present invention. Furthermore, it is to be understood that the various embodiments shown in the Figures are illustrative representations and are not necessarily drawn to scale.

A hybrid wafer or substrate dicing process involving an initial laser scribe and subsequent plasma etch may be implemented for die singulation. The laser scribe process may be used to cleanly remove a maskless street region, organic and/or inorganic dielectric layers, and/or device layers. The laser etch process may then be terminated upon exposure of, or partial etch of, the underlying wafer or substrate. The plasma etch portion of the dicing process may then be employed to etch through the bulk of the wafer or substrate, such as through bulk single crystalline silicon, to yield die or chip singulation or dicing. In particular embodiments herein, a method to dice wafers with a pre-patterned dry laminate mask for plasma singulation are described. It is to be appreciated that lasing the sample prior to application of the pre-patterned mask need not be a necessary operation. In one scenario, running a laser ablation process on the surface of the wafer without a mask may cause yield problems. It is also to be appreciated that it may be viable to apply the pre-patterned mask and then laser the street area. Also, the entire street area may need not be scribed, but rather only areas that might otherwise cause issues during the etch portion of the process flow.

To provide context, embodiments described herein may relate to the semiconductor industry and, specifically, to processes for dicing integrated circuit devices ("chips") from semiconductor wafers prior to packaging individualized chips. Three-dimensional (3D) packaging trends have led to the use of wafer thinning prior to singulation ("dicing") into chips, e.g., to a thickness of less than 100 microns and as thin as 50 microns or thinner. A common approach for dicing semiconductor wafers has been by physical abrasion through the application of rotating saw blades, for an example, or by scribing and breaking wafers along designated dicing streets, as another example. Such physical methods have the potential for wafer breakage and yield loss or creation of defectively and reduced life span of the resulting devices. Plasma dicing has been used as an alternative to physical dicing to prevent such problems. In plasma dicing, a substrate (that is or will be affixed to a suitable carrier) is first coated with a suitable mask. The mask is patterned to provide open masks areas over designated dicing streets. Material in the dicing streets such as test structures are optionally removed (e.g., by laser ablation) if necessary, and then the wafer is plasma etched by a directional plasma etching process to singulate the wafers into individual dies. The finished and singulated dies are then picked from the carrier and packaged into devices and products. One or more embodiments described herein are directed to circumventing the need for a separate, dedicated, or combined patterning step by providing a mask in the form of a pre-patterned dry laminate mask in the place of a blanket mask.

Figure 1B:
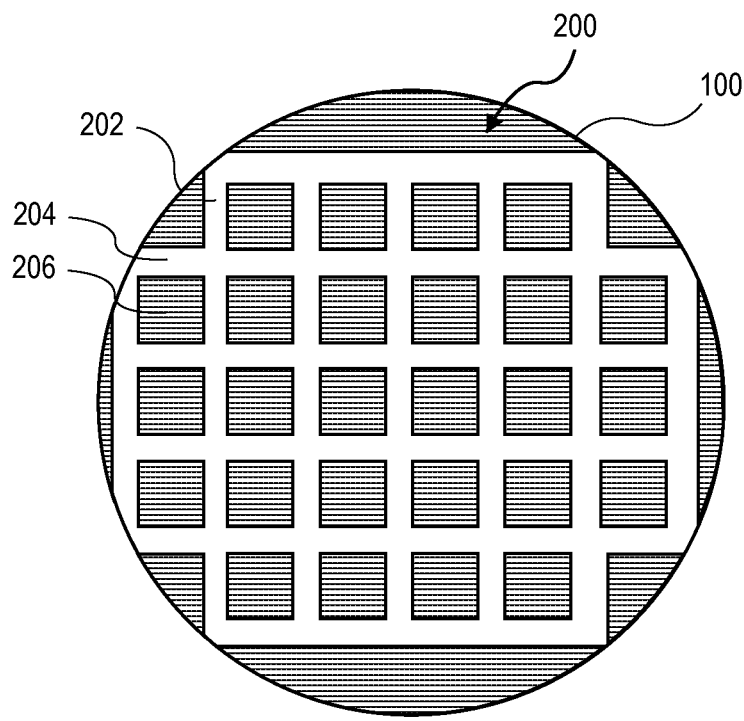
FIG. 1B illustrates a top plan of the semiconductor wafer of FIG. 1A having a pre-patterned dicing mask disposed thereon, in accordance with an embodiment of the present invention.

Thus, in an aspect of the present invention, a pre-patterned mask is employed in the dicing of a semiconductor wafer into singulated integrated circuits. As a general example, FIG. 1A illustrates a top plan of a semiconductor wafer to be diced. FIG. 1B illustrates a top plan of a semiconductor wafer having a pre-patterned dicing mask disposed thereon, in accordance with an embodiment of the present invention.

Referring to FIG. 1A, a semiconductor wafer 100 has a plurality of regions 102 that include integrated circuits. The regions 102 are separated by vertical streets 104 and horizontal streets 106. The streets 104 and 106 are areas of semiconductor wafer that do not contain integrated circuits, but may include test structures, and are designed as locations along which the wafer will be diced. Some embodiments of the present invention involve the use of a combination laser scribe and plasma etch technique to cut trenches through the semiconductor wafer along the streets such that the dies are separated into individual chips or die. However, in other embodiment, an etch-only process is used. In yet another embodiment all of the cutting is performed by the laser, and etch is used only to clean up the heat affected zone, or is not even used at all. In any case, since both a laser scribe and a plasma etch process are crystal structure orientation may be independent, the crystal structure of the semiconductor wafer to be diced may be immaterial to achieving a vertical trench through the wafer. It is to be appreciated that silicon is diamond cubic and therefore direction does not matter for linear processes such as one-photon light absorption, but for high power laser ablation, such as with femtosecond lasers, this may not necessarily hold true.

Referring to FIG. 1B, the semiconductor wafer 100 has a pre-patterned mask layer 200 (made up of region 206) formed thereon. The integrated circuit regions 102 of the semiconductor wafer 100 are covered and protected by the pre-patterned mask layer 200. The regions 206 of the pre-patterned mask layer 200 are positioned such that during a subsequent etching process, the underlying integrated circuit regions 102 are not degraded by the etch process. It is to be appreciated that horizontal gaps 204 and vertical gaps 202 between the regions 206 define the areas that will be etched during the etching process to finally dice the semiconductor wafer 100.

Figure 2A:
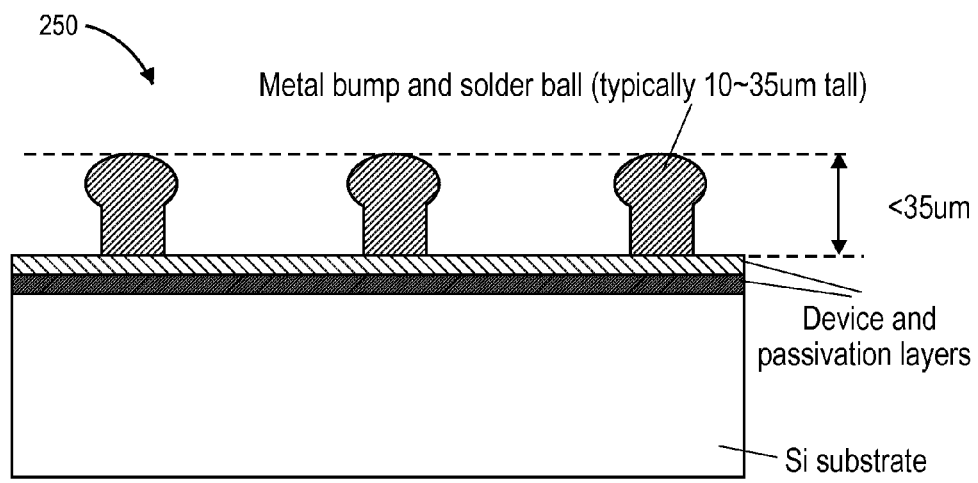
FIG. 2A illustrates a cross-sectional view of a portion of a state-of-the-art wafer.
Figure 2B:
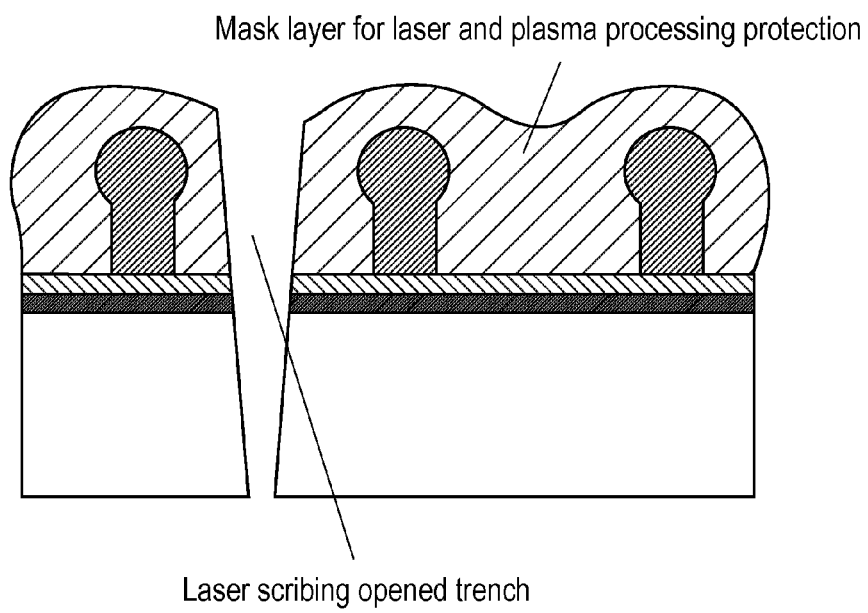
FIG. 2B illustrates a cross-sectional view representing an operation in a dicing process for a portion of the state-of-the-art wafer of FIG. 2A.

In an aspect of the present disclosure, the use of a pre-patterned mask eliminates the need for patterned an etch mask, e.g., with the use of a laser process or a photolithography process to pattern the mask. To provide thorough comparison, FIG. 2A illustrates a cross-sectional view of a portion of a state-of-the-art wafer having metal bumps and pillars formed thereon. Referring to FIG. 2A, wafer 250 has thereon chips having metal bumps and solder balls that are typically 10-35 microns tall. The chips also include device and passivation layers, all disposed on a Si substrate. FIG. 2B illustrates a cross-sectional view representing an operation in a dicing process for a portion of the state-of-the-art wafer of FIG. 2A. Referring to FIG. 2B, a blanket mask layer is disposed above the structure of FIG. 2A. Laser scribing is performed to pattern the mask and provide a trench between the bump/solder balls. Plasma etching may then be performed through the trench for wafer dicing.

By contrast to FIGS. 2A and 2B, in other approaches, a maskless dicing scheme has been implemented. As an example, FIGS. 3A-3E illustrate cross-sectional views of a portion of a wafer 350 including a plurality of chips (integrated circuits) during performing of a maskless method of dicing the semiconductor wafer.

Figure 3A:
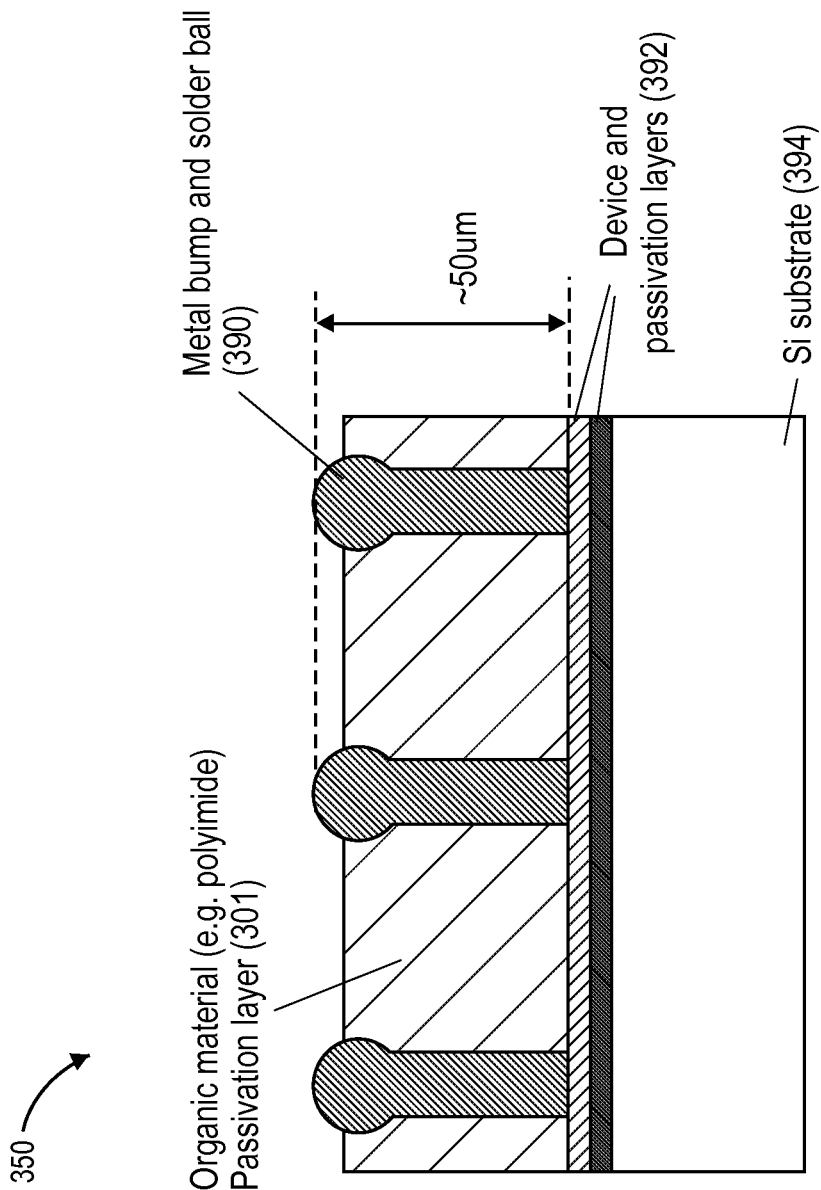
FIGS. 3A-3E illustrate cross-sectional view of a semiconductor wafer including a plurality of integrated circuits during performing of a maskless method of dicing the semiconductor wafer.
Figure 3B:
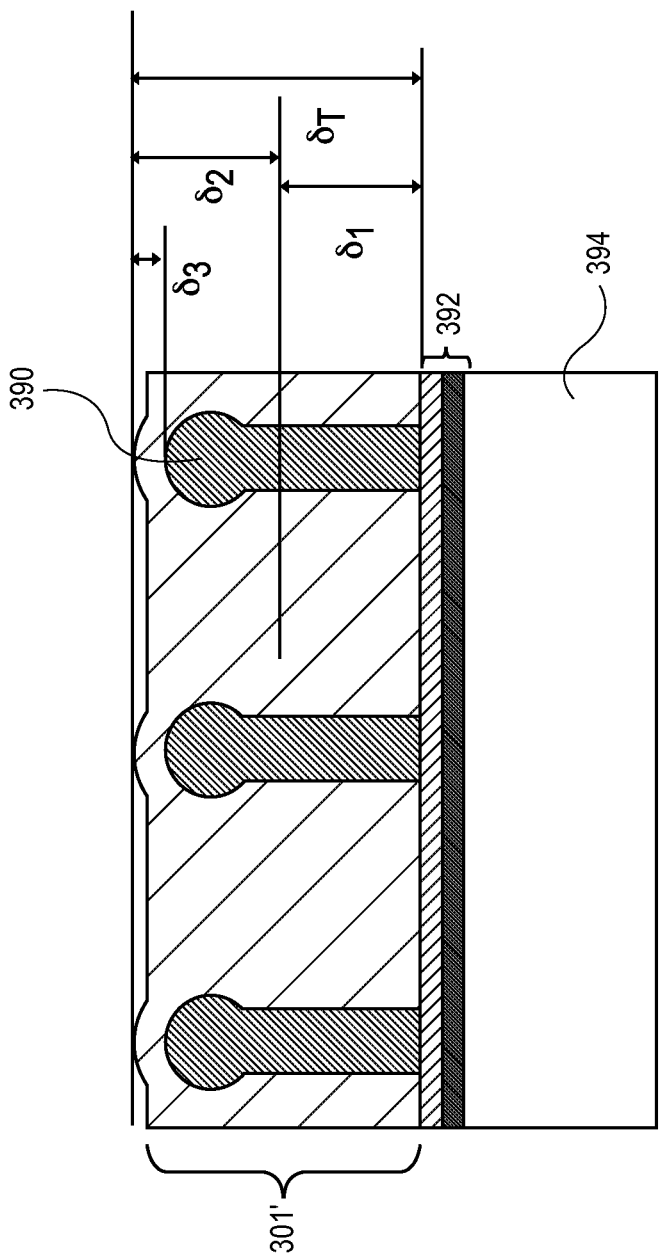

Referring to FIG. 3A, wafer 350 includes dies having metal bump/solder ball pairs 390 that are approximately 50 microns or taller. An approximately 35-50 micron organic layer, such as a polyimide layer, is used as a passivation layer 301 between the metal bump/solder ball pairs, exposing only the uppermost portion of these pairs. The passivation layer 301 may be a necessary structural component of the dies. The dies also include device and passivation layers 392, all of which are disposed on a substrate 394, such as a silicon (Si) substrate. It is to be appreciated that, in an embodiment described in association with FIG. 3A, an example is provided where the passivation layer is organic such as a polyimide. In another embodiment, a passivation layer includes a nitride/oxide of silicon (non-organic). Embodiments may include single or multiple passivation layers. Referring to FIG. 3B, the passivation layer 301 of FIG. 3A is shown as a thicker passivation layer 301' covering and protecting the exposed bump/solder ball pairs 390. Although the thickening of passivation layer 301 to 301' is shown as being step-wise from FIG. 3A to 3B, i.e., additional passivation layer (such as additional polyimide) is added to an already formed passivation film which may be a silicon nitride, silicon oxide or combination of both and other inorganic layers. However, the initial thickness of the passivation layer can be as shown in FIG. 3B, i.e., the initial thickness is of layer 301' which is formed above and covering the exposed bump/solder ball pairs 390. Referring again to FIG. 3B, $\delta_T$ represents total film thickness, $\delta_1$ represents target film thickness as a desired final passivation layer thickness, $\delta_2$ represents additional film thickness to be consumed as during plasma dicing and/or ashing, and $\delta_3$ represents the minimum film thickness needed to protect bumps from exposure during dicing.

Figure 3C:
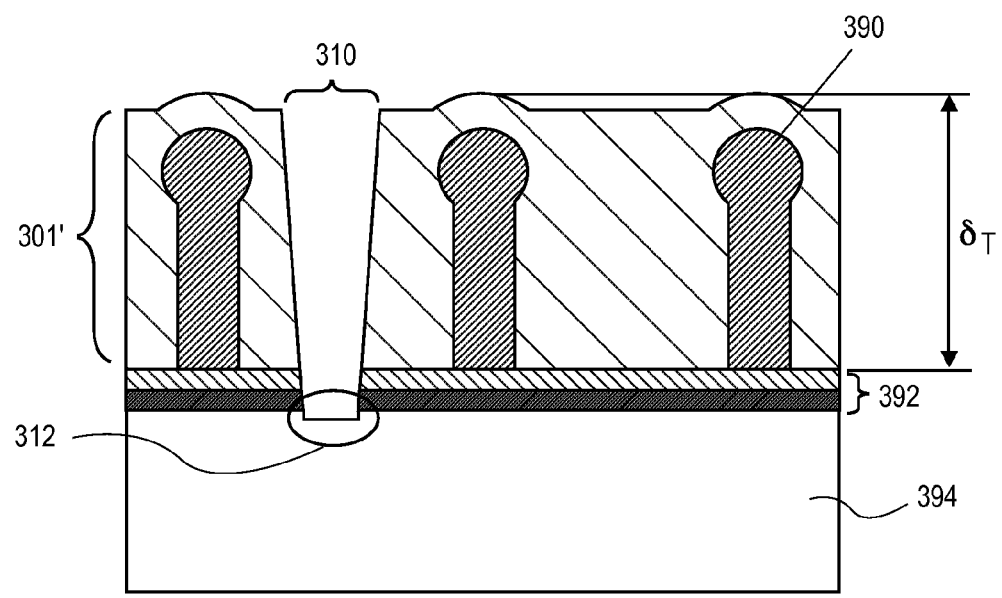

Referring to FIG. 3C, the passivation layer 301' is patterned with a laser scribing process to provide gaps 310. The laser scribing process is also used to scribe the device and passivation layers 392, exposing regions of the substrate 394 between the integrated circuits (i.e., between individual dies). The laser scribing process may be performed along streets (not shown here) formed in the device and passivation layers 392. The laser scribing process may further forms trenches 312 partially into the regions of the substrate 394 between the integrated circuits, as depicted in FIG. 3C.

Figure 3D:
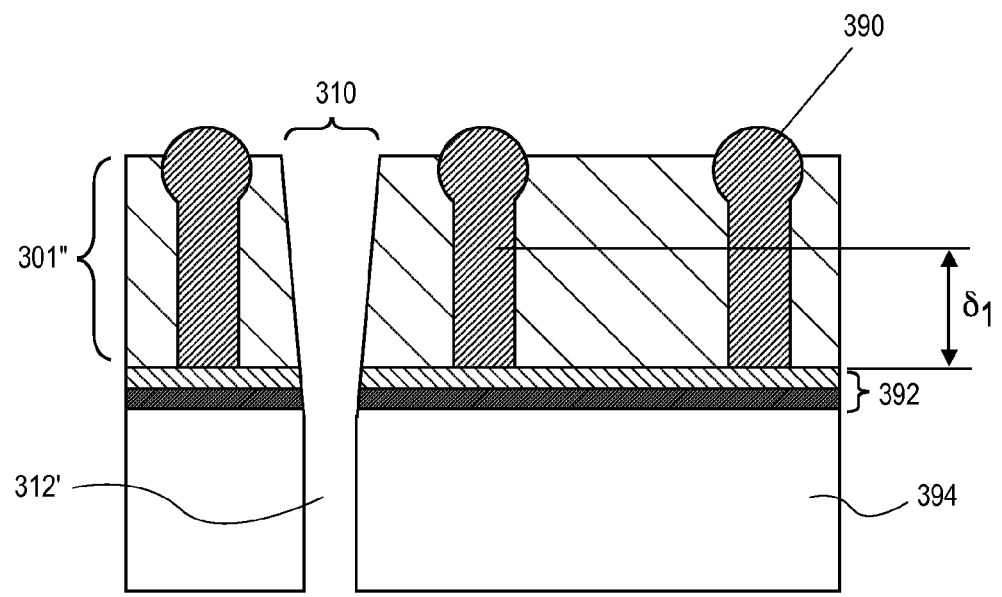

Referring now to FIG. 3D, the wafer 350 is etched through the scribe lines in the patterned passivation layer 301 to singulate the integrated circuits. Etching the wafer 350 may include ultimately etching entirely through the wafer 350, as depicted in FIG. 3D. The etching is along trenches 312 to extend and form complete trenches 312' through the substrate 394. Referring again to FIG. 3D, the plasma etching also recesses the passivation layer 301' to a reduced thickness 301". Although recessed somewhat, the remaining polymer thickness 301" is still more than the target passivation layer thickness $\delta_1$.

Figure 3E:
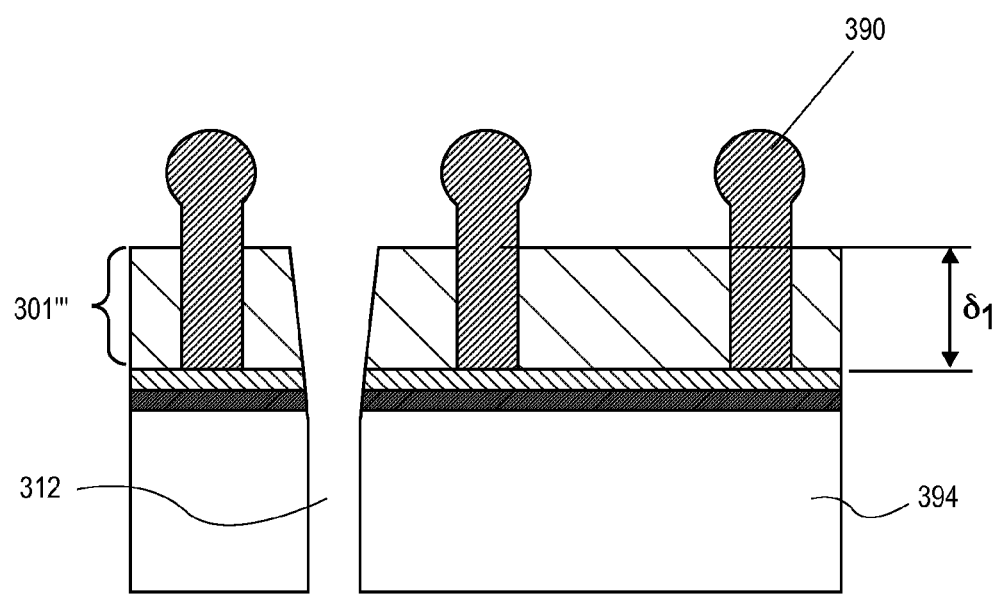

Referring to FIG. 3E, the passivation layer 301" is further thinned to a final passivation layer 301''' having the target value $\delta_1$. The additional thinning may be performed by using a plasma ash process. Following the plasma ashing process, additional processing may include wafer/die cleaning, die pack, die attach, soldering, etc.

In another aspect, and in accordance with one or more embodiments described herein, prior to plasma dicing, a substrate is prepared for plasma dicing by application of a pre-patterned mask. In one such embodiment, the use of a laser scribe for the mask can be avoided, although a laser scribing operation may still be implemented for layers below the pre-patterned mask layer. Additionally, use of a pre-patterned mask may offer advantages over the above described maskless approach since a cleaning operation used for mask removal may also assist in the reduction of yield reducing defects created during any laser or etch processes. Thus, in contrast to FIGS. 2A and 2B and FIGS. 3A-3E, FIGS. 4A-4E illustrate cross-sectional views of a semiconductor wafer including a plurality of integrated circuits during performing of a method of dicing the semiconductor wafer using a pre-patterned dry laminate mask for plasma singulation, in accordance with an embodiment of the present invention.

Figure 4A:
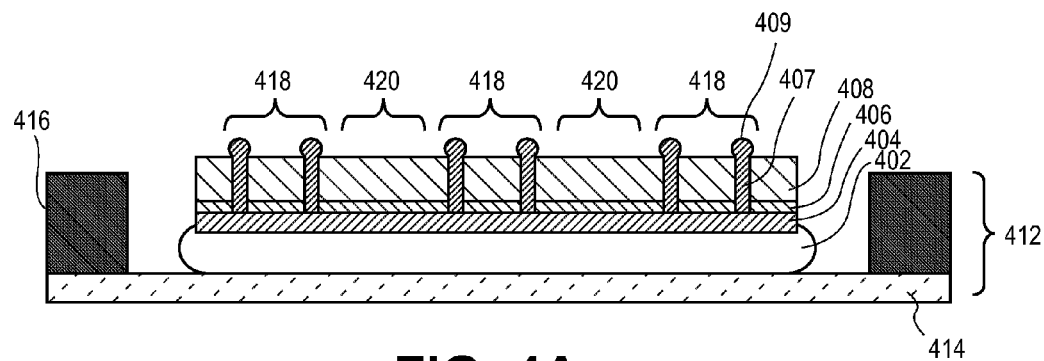
FIGS. 4A-4E illustrate cross-sectional view of a semiconductor wafer including a plurality of integrated circuits during performing of a method of dicing the semiconductor wafer using a pre-patterned dry laminate mask for plasma singulation, in accordance with an embodiment of the present invention.

Referring to FIG. 4A, a wafer 402 is provided on a substrate carrier 412. The wafer 402 may include device layer(s) 404, passivation layer(s) 406, pillars 407 and corresponding contact bumps 409, and a molding compound and/or under-fill material layer 408. In an embodiment, in the case that layer 408 includes a molding compound, the molding compound is composed of a polyimide material or some other suitable material which may be a composite material or an epoxide, for example. In an embodiment, in the case that layer 408 includes an under-fill material layer, the under-fill material layer is composed of a material that can be formed by a method implemented prior to singulation, e.g., a hot melt material or a dry laminate material. In one such embodiment, however, a method that would otherwise be performed after singulation or after singulated die stacking is not used, e.g., a capillary fill method is not implemented. The wafer 402 may be attached to the substrate carrier 412 which may include a dicing tape 414 and frame 416 assembly, as is depicted in FIG. 4A.

In an embodiment, the wafer 402 has been thinned to approximately 30 to 300 microns from an initial approximately 800 microns. Additionally, the wafer includes device (integrated circuit) regions 418 and street regions 420, as is depicted in FIG. 4A. As shown, the street regions 420 may in some embodiments be covered by the molding compound and/or under-fill material layer 408 and the passivation layer(s) 406. In other embodiments, however, the street regions 420 may be provided as exposing the device layer 404 in the street region 420. In the latter embodiment, the passivation layer(s) 406 may be removed from the street regions 420 in a final wafer patterning operation and the molding compound and/or under-fill material layer 408 may be removed from the street regions 420 by an ablation operation pre or post dicing of the wafer 402.

Figure 4B:
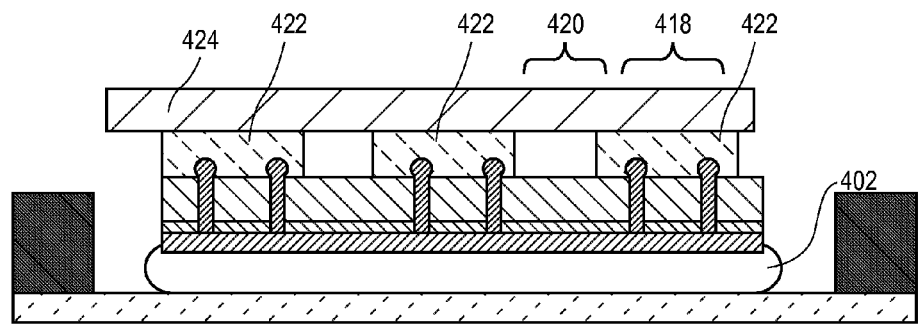

Referring to FIG. 4B, a pre-patterned mask 422 is laminated on the front surface of the semiconductor wafer 402. The pre-patterned mask 422 covers the integrated circuit regions 418 and exposes the street regions 420 between the integrated circuit regions 418. That is, the patterned areas of the pre-patterned mask 422 are aligned with the street regions 420 during the lamination process. In an embodiment, the pre-patterned mask 422 is a dry laminated pre-patterned mask.

Figure 5:
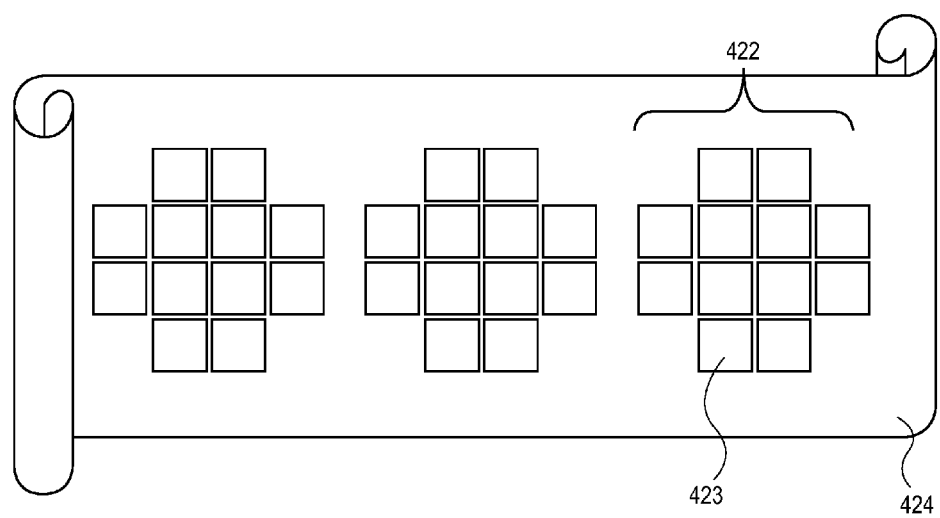
FIG. 5 illustrates a top-down view of a reel-to-reel carrier film that supports a plurality of pre-patterned masks, in accordance with an embodiment of the present invention.

In an embodiment, the pre-patterned mask 422 is laminated using a carrier film or tape 424, as depicted in FIG. 4B. In one such embodiment, the pre-patterned mask 422 is laminated using a reel-to-reel carrier film that supports the pre-patterned mask 422. As an example, FIG. 5 illustrates a top-down view of a reel-to-reel carrier film that supports a plurality of pre-patterned masks, in accordance with an embodiment of the present invention. Referring to FIG. 5, a reel-to-reel carrier film 424 supports a plurality of pre-patterned masks 422. The pre-patterned masks are composed of a mask material 423. In one embodiment, the reel-to-reel roll of the carrier film 424 is composed of a suitable material, such as polyethylene terephthalate (PET) with a properly sized array of individual pre-patterned masks 422 or "masklets" composed of a suitable masking material such as poly-vinyl alcohol (PVA; other possible mask materials are described below). In an embodiment, the array of masklets is arranged to fit over the devices of a silicon wafer but not cover the streets when placed correctly over the silicon wafer.

In an embodiment, the pre-patterned mask 422 is applied to the wafer 402 by a suitable process such as a vacuum laminator based process. It is to be appreciated that special care in alignment (e.g., micro adjustment aided by optical signal feedback) may be required to assist the proper placement of the masklet array. A vacuum laminator may be a preferred method of applying such a pre-patterned mask film since air gaps under the film can be avoided although other, non-vacuum lamination techniques may also be suitable. As well, much reduced stress on the film may be achieved as is often encountered in alternative laminating approaches such as rolling. In an embodiment, the carrier film 424 is removed by a peeling process which may be enhanced by the use of an ultra-violet (UV) release adhesive included between the mask material 423 and the carrier film 424.

In an embodiment, the pre-patterned mask 422 is a water-soluble mask layer. In an embodiment, the water-soluble mask layer is readily dissolvable in an aqueous media. For example, in one embodiment, the water-soluble mask layer is composed of a material that is soluble in one or more of an alkaline solution, an acidic solution, or in deionized water. In an embodiment, the water-soluble mask layer maintains its water solubility upon exposure to a heating process, such as heating approximately in the range of 50-160 degrees Celsius. For example, in one embodiment, the water-soluble mask layer is soluble in aqueous solutions following exposure to chamber conditions used in a laser and plasma etch singulation process. In one embodiment, the water-soluble mask layer is composed of a material such as, but not limited to, polyvinyl alcohol, polyacrylic acid, dextran, polymethacrylic acid, polyethylene imine, or polyethylene oxide. In a specific embodiment, the water-soluble mask layer has an etch rate in an aqueous solution approximately in the range of 1-15 microns per minute and, more particularly, approximately 1.3 microns per minute.

In another embodiment, the pre-patterned mask 422 is a UV-curable mask layer. In an embodiment, the mask layer has a susceptibility to UV light that reduces an adhesiveness of the UV-curable layer by at least approximately 80%. In one such embodiment, the UV layer is composed of polyvinyl chloride or an acrylic-based material. In an embodiment, the UV-curable layer is composed of a material or stack of materials with an adhesive property that weakens upon exposure to UV light. In an embodiment, the UV-curable adhesive film is sensitive to approximately 365 nm UV light. In one such embodiment, this sensitivity enables use of LED light to perform a cure.

In another embodiment, the pre-patterned mask 422 is a layer such as, but not limited to, a photo-resist layer or an Mine patterning layer. For example, a polymer layer such as a photo-resist layer may be composed of a material otherwise suitable for use in a lithographic process. In one embodiment, the photo-resist layer is composed of a positive photo-resist material such as, but not limited to, a 248 nanometer (nm) resist, a 193 nm resist, a 157 nm resist, an extreme ultra-violet (EUV) resist, or a phenolic resin matrix with a diazonaphtho-quinone sensitizer. In another embodiment, the photo-resist layer is composed of a negative photo-resist material such as, but not limited to, poly-cis-isoprene and poly-vinyl-cinnamate.

To provide further context, past approaches for providing an etch mask for a singulation process have included forming a blanket coating of mask material by a process such as spin coating, spray coating, silk screening, or dry film lamination, where the blanket coating covers both device regions and street regions equally. The blanket mask material is then patterned in a patterning operation, such as laser ablation, that removes the mask material when required to facilitate the subsequent etching process. The wafer is then plasma etched to provide the singulation. By contrast, in accordance with embodiments described herein, the pre-patterned mask 422 is advantageously already patterned and does not need to be patterned along the street regions prior to plasma etching. Masking materials may be several tens of microns thick and can otherwise be subjected to time consuming patterning to remove in processes which may further be associated with defects such as roughness, "striations," and micro-masking. Such defects can otherwise be especially troubling in that they may lead to defects in the subsequent etch process, and either must be removed after or during the etch, may slow down the etch process, especially for long and deep singulation etches, due to micro-masking and sidewall roughness, or may not be completely removable thus leading to a marginal increase in defectivity and yield loss. In an embodiment, use of a pre-patterned mask avoids such issues. The pre-patterned mask may be manufactured in various ways including stencil printing whereby the mask material is applied through a stencil onto the carrier film. The film thickness is determined by the thickness of the stencil. This sort of manufacturing process allows the production of a clean mask edge with uniform mask thickness and composition thus allowing avoidance of the potential issues during the subsequent etching process.

Figure 4C:
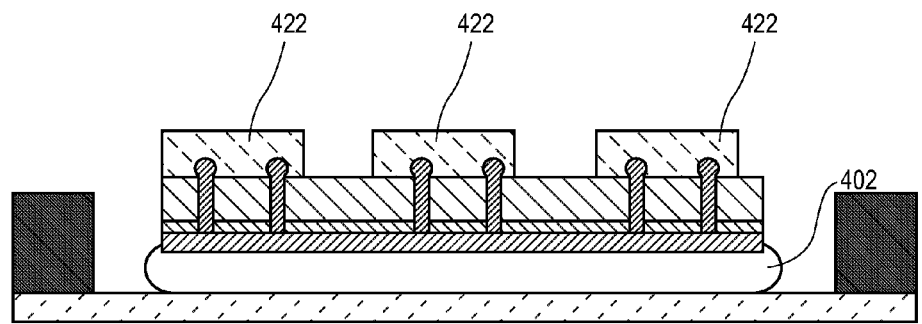

Referring to FIG. 4C, the carrier film or tape 424 is released following lamination of the pre-patterned mask 422 to the wafer 402. In the state shown in FIG. 4C, it is to be appreciated that the wafer 402 is ready for singulation.

Figure 4D:
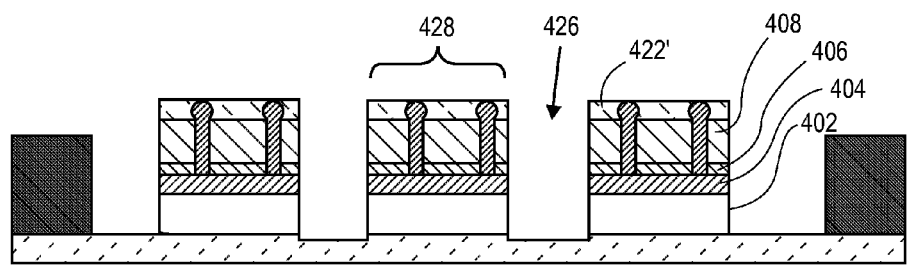

Referring to FIG. 4D, the wafer 402 is plasma etched through the street regions 420 to provide singulated integrated circuits 428. The pre-patterned mask 422 protects the integrated circuits 418/428 during the plasma etching. In one such embodiment, the pre-patterned mask 422 is somewhat reduced in thickness to leave a post plasma mask 422' as a result of a non-zero etch rate for the mask material. Nonetheless, any etch rate of the pre-patterned mask 422 is small compared with the etch rate of the material exposed in the street regions 420, including the wafer 402. As such, any etch of the pre-patterned mask 422 is non-detrimental to the process.

In accordance with an embodiment of the present invention, referring again to FIG. 4D, prior to the plasma etching, laser scribing of the street regions 420 is performed to provide scribe lines 426 between the integrated circuit regions 418. The plasma etching described above is then performed through the scribe lines to singulate the integrated circuits 428. In one such embodiment, the laser scribing involves laser scribing the molding compound and/or under-fill material layer 408, the passivation layer 406 and, possibly, test structures formed in the device layer 404. In a specific embodiment, the laser scribing further involves forming trenches in the wafer 402, between the integrated circuits 418/428, and the plasma etching is performed through the scribe lines 426 to form trench extensions corresponding to the trenches and, ultimately, to singulate the dies.

Figure 4E:
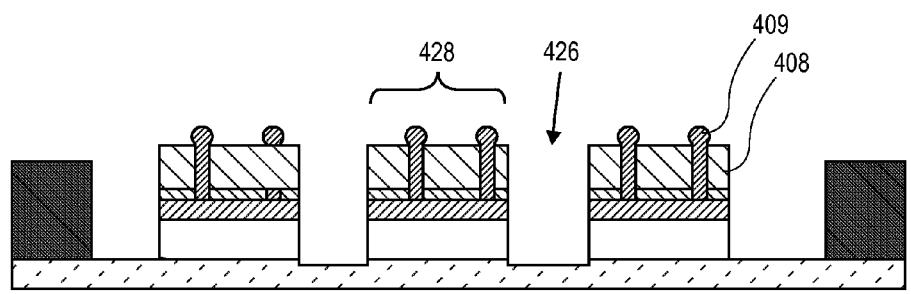

Referring to FIG. 4E, in an embodiment, the pre-patterned mask 422 (or reduced mask 422') is removed. In one such embodiment, the pre-patterned mask 422 is composed of a water-soluble material, and removing the pre-patterned mask 422 involves using an aqueous-based treatment. In another embodiment, the pre-patterned mask 422 is removed by burnishing with a solvent. It is to be appreciated that, either before or after mask removal, the singulated dies are now ready for picking from the dicing tape.

In another aspect, with reference to FIGS. 4A-4E, the masking material (422/423) may instead be retained in place after etching in order to act as additional molding and under-fill material in subsequent packaging operations. If used as an underfill material, the pre-patterned mask can be tailored to provide properties such as good conformality and flowability, be electrically insulating, and have good thermal stability and conductivity.

More specifically, in an embodiment, when one chip is stacked on top of another or on a package substrate, a material referred to as an "under-fill layer" is typically implemented on the top of the chips (device side) to create a thermal short and also to provide a mechanically stable connection between the stacked chips. Such an under-fill material should generally have (1) very low electrical conductivity, (2) high thermal conductivity, (3) coefficient of thermal expansion closely matched to the chip bulk material e.g. silicon, (4) good adhesion to the various passivation layers and molding compounds that are used on the tops and bottoms of the chips e.g. silicon nitrides, oxides, polyimides, and (5) advantageous rheology allowing formability around the topology of the pillars and bumps found on the device side of the chip without leaving voids. Examples of suitable commercially available materials for the underfill layer include B-staged epoxy such as Intervia™ or Cyclotene™ both by Dow Chemical, polyimides such as Pimel™ available from Asahi KASEI, polybenzoxazoles such as Sumiresin™ available from Sumitomo Bakelite. Many other materials are also available.

Providing further context, previous approaches for applying an under-fill layer have included: (1) capillary action flow of an under-fill curable liquid between two chips of the already assembled stack, (2) application of a "hot melt" material to the top or bottom of a chip prior to stacking which flows when heated, and (3) application of a dry laminate to the top of the finished chip prior to stacking. However, the capillary action flow approach often encounters difficulties in balancing the required wettability of the chip/flow material interface against the force that the capillary action places on the thinned and very delicate chips. Meanwhile, hot melt approaches are still being investigated and have not been optimized. Another method may be the application of a dry laminate, where a dry film is applied in a physical manner to the top of the finished chip prior to stacking, but following singulation.

By contrast, in accordance with one or more embodiments described herein, and as depicted in association with one possible embodiment of FIGS. 4A-4E, a physical application approach to introducing an underfill material layer is implemented, but prior to die singulation. This method can be referred to as "wafer level underfill." In one such embodiment, the implementation involves physically rolling a bilayer tape onto the surface of a wafer prior to dicing whereby the bottom layer of the bilayer tape flows around the copper bumps and pillars and the top layer acts as a carrier and is peeled away. A reveal process may be performed where the laminate is thinned from the top, e.g., by plasma ashing, to reveal the contact areas of the bumps. When such a reveal process is performed by an ashing process (e.g., a dry oxygen plasma etch plus potentially other reactant gasses such as ammonia), the process may be advantageously clean, allowing for improved yield and reliability. In other embodiments, a molding compound, or a combination of a molding compound and underfill material layer is used.

Thus, it is to be appreciated, that embodiments described herein are not limited to dicing of wafers having underfill and/or molding compound layers pre-formed thereon. For example, FIGS. 6A-6E illustrate cross-sectional view of a semiconductor wafer including a plurality of integrated circuits during performing of another method of dicing the semiconductor wafer using a pre-patterned dry laminate mask for plasma singulation, in accordance with an embodiment of the present invention.

Figure 6A:
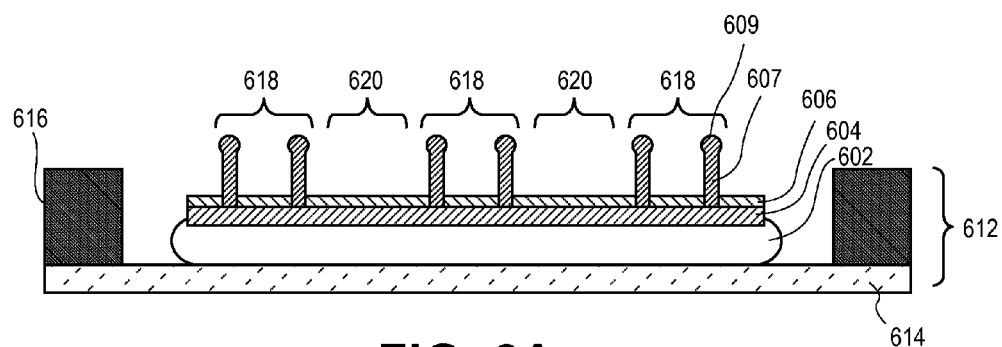
FIGS. 6A-6E illustrate cross-sectional view of a semiconductor wafer including a plurality of integrated circuits during performing of another method of dicing the semiconductor wafer using a pre-patterned dry laminate mask for plasma singulation, in accordance with an embodiment of the present invention.

Referring to FIG. 6A, a wafer 602 is provided on a substrate carrier 612. The wafer 602 may include device layer(s) 604, passivation layer(s) 606, and pillars 607 with corresponding contact bumps 609. However, at this stage at least, a molding compound and/or under-fill material layer is not included. The wafer 602 may be attached to the substrate carrier 612 which may include a dicing tape 614 and frame 616 assembly, as is depicted in FIG. 6A. Additionally, the wafer includes device (integrated circuit) regions 618 and street regions 620. As shown, the street regions 620 may in some embodiments be covered by the passivation layer(s) 406. In other embodiments, however, the street regions 620 may be provided as exposing the device layer 604 in the street region 620. In the latter embodiment, the passivation layer(s) 606 may be removed from the street regions 620 in a final wafer patterning operation.

Figure 6B:
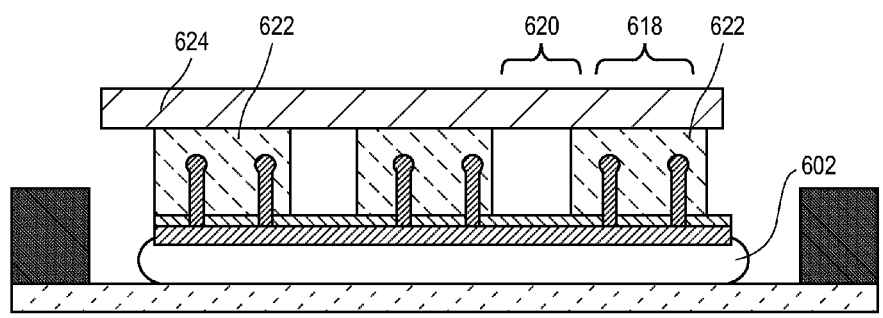

Referring to FIG. 6B, a pre-patterned mask 622 is laminated on the front surface of the semiconductor wafer 602. The pre-patterned mask 622 covers the integrated circuit regions 618 and exposes the street regions 620 between the integrated circuit regions 618. That is, the patterned areas of the pre-patterned mask 622 are aligned with the street regions 620 during the lamination process. In an embodiment, the pre-patterned mask 622 is a dry laminated pre-patterned mask applied using a carrier 624, as described in association with FIG. 4B.

In an embodiment, the pre-patterned mask layer 622 is also an underfill material layer and is formed between and covering metal pillar/solder bump pairs (607/609) of the integrated circuit region 618. However, in other embodiments, the pre-patterned mask 622 is a water-soluble mask layer, a UV-curable mask layer, a photo-resist layer or an Mine patterning layer, as described in association with FIG. 4B.

Figure 6C:
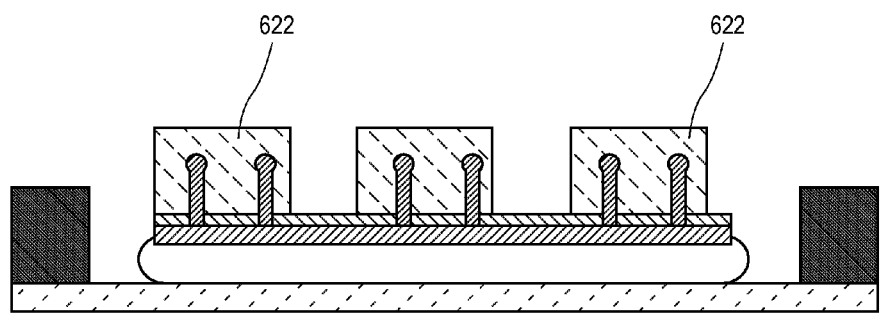

Referring to FIG. 6C, the carrier film or tape 624 is released following lamination of the pre-patterned mask 622 to the wafer 602. In the state shown in FIG. 6C, it is to be appreciated that the wafer 602 is ready for singulation.

Figure 6D:
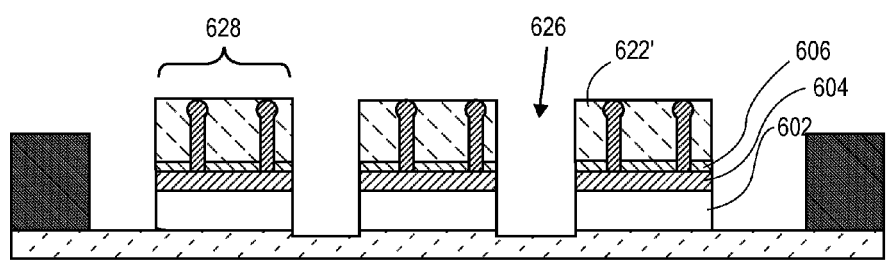

Referring to FIG. 6D, the wafer 602 is plasma etched through the street regions 620 to provide singulated integrated circuits 628. The pre-patterned mask 622 protects the integrated circuits 618/628 during the plasma etching. In one such embodiment, the pre-patterned mask 622 is somewhat reduced in thickness to leave a post plasma mask 622' as a result of a non-zero etch rate for the mask material. Nonetheless, any etch rate of the pre-patterned mask 622 is small compared with the etch rate of the material exposed in the street regions 620, including the wafer 602. As such, any etch of the pre-patterned mask 622 is non-detrimental to the process.

In accordance with an embodiment of the present invention, referring again to FIG. 6D, prior to the plasma etching, laser scribing of the street regions 620 is performed to provide scribe lines 626 between the integrated circuit regions 618. The plasma etching described above is then performed through the scribe lines to singulate the integrated circuits 628. In one such embodiment, the laser scribing involves laser scribing the passivation layer 606 and, possibly, test structures formed in the device layer 604. In a specific embodiment, the laser scribing further involves forming trenches in the wafer 602, between the integrated circuits 618/628, and the plasma etching is performed through the scribe lines 626 to form trench extensions corresponding to the trenches and, ultimately, to singulate the dies.

Figure 6E:
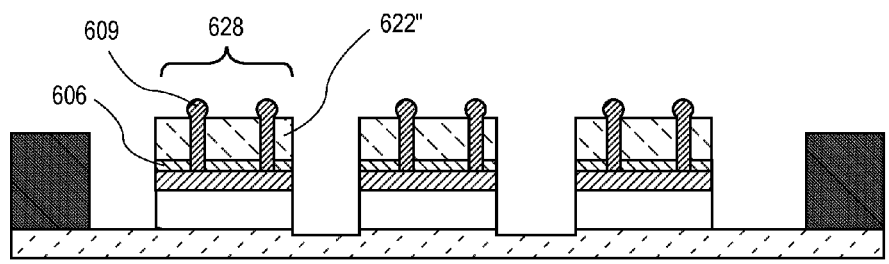

Referring to FIG. 6E, in an embodiment where the pre-patterned mask layer 622 is an underfill material layer, the reduced pre-patterned mask layer 622' is further reduced in thickness to provide a final underfill material layer 622" that exposes metal bumps 609 of the singulated integrated circuits 628. In an embodiment, a dry cleaning process, such as an oxygen plus ammonia ashing plasma process, is used to reduce the thickness and provide the final underfill material layer 622". In one such embodiment, the operation renders the contact bumps 609 clean and free of any contaminants while optimizing the remaining amount of the under-fill material layer 622" for a good quality subsequent die stacking process.

In another embodiment, the pre-patterned mask 622 (or reduced mask 622') is completely removed. In one such embodiment, the pre-patterned mask 622 is composed of a water-soluble material, and removing the pre-patterned mask 622 involves using an aqueous-based treatment. In another embodiment, the pre-patterned mask 622 is removed by burnishing with a solvent.

Referring again to FIGS. 4A-4E and to FIGS. 6A-6E, in an embodiment, the wafer 402 or 602, respectively, is substantially composed of a material suitable to withstand a fabrication process and upon which semiconductor processing layers may suitably be disposed. For example, in one embodiment, semiconductor wafer or substrate is composed of a group IV-based material such as, but not limited to, crystalline silicon (as shown), germanium or silicon/germanium. In a specific embodiment, providing semiconductor wafer includes providing a monocrystalline silicon substrate. In a particular embodiment, the monocrystalline silicon substrate is doped with impurity atoms. In another embodiment, semiconductor wafer or substrate is composed of a material such as, e.g., a material substrate used in the fabrication of light emitting diodes (LEDs).

In an embodiment, the semiconductor wafer has disposed thereon or therein, as a portion of the integrated circuits, an array of semiconductor devices. Examples of such semiconductor devices include, but are not limited to, memory devices or complimentary metal-oxide-semiconductor (CMOS) transistors fabricated in a silicon substrate and encased in a dielectric layer. A plurality of metal interconnects may be formed above the devices or transistors, and in surrounding dielectric layers, and may be used to electrically couple the devices or transistors to form the integrated circuits. Materials making up the streets may be similar to or the same as those materials used to form the integrated circuits. For example, the streets may be composed of layers of dielectric materials, semiconductor materials, and metallization. In one embodiment, one or more of the streets includes test devices similar to the actual devices of the integrated circuits.

In an embodiment, as described above, a laser scribing operation may be used in conjunction with a pre-patterned dry laminate mask for singulation. In one such embodiment, the laser scribing process involves using a laser having a pulse width in the femtosecond range. Specifically, a laser with a wavelength in the visible spectrum plus the ultra-violet (UV) and infra-red (IR) ranges (totaling a broadband optical spectrum) may be used to provide a femtosecond-based laser, i.e., a laser with a pulse width on the order of the femtosecond ($10^{-15}$ seconds). In one embodiment, ablation is not, or is essentially not, wavelength dependent and is thus suitable for complex films such as films of a passivation layer or stack, the streets and, possibly, a portion of the Si wafer.

Figure 7:
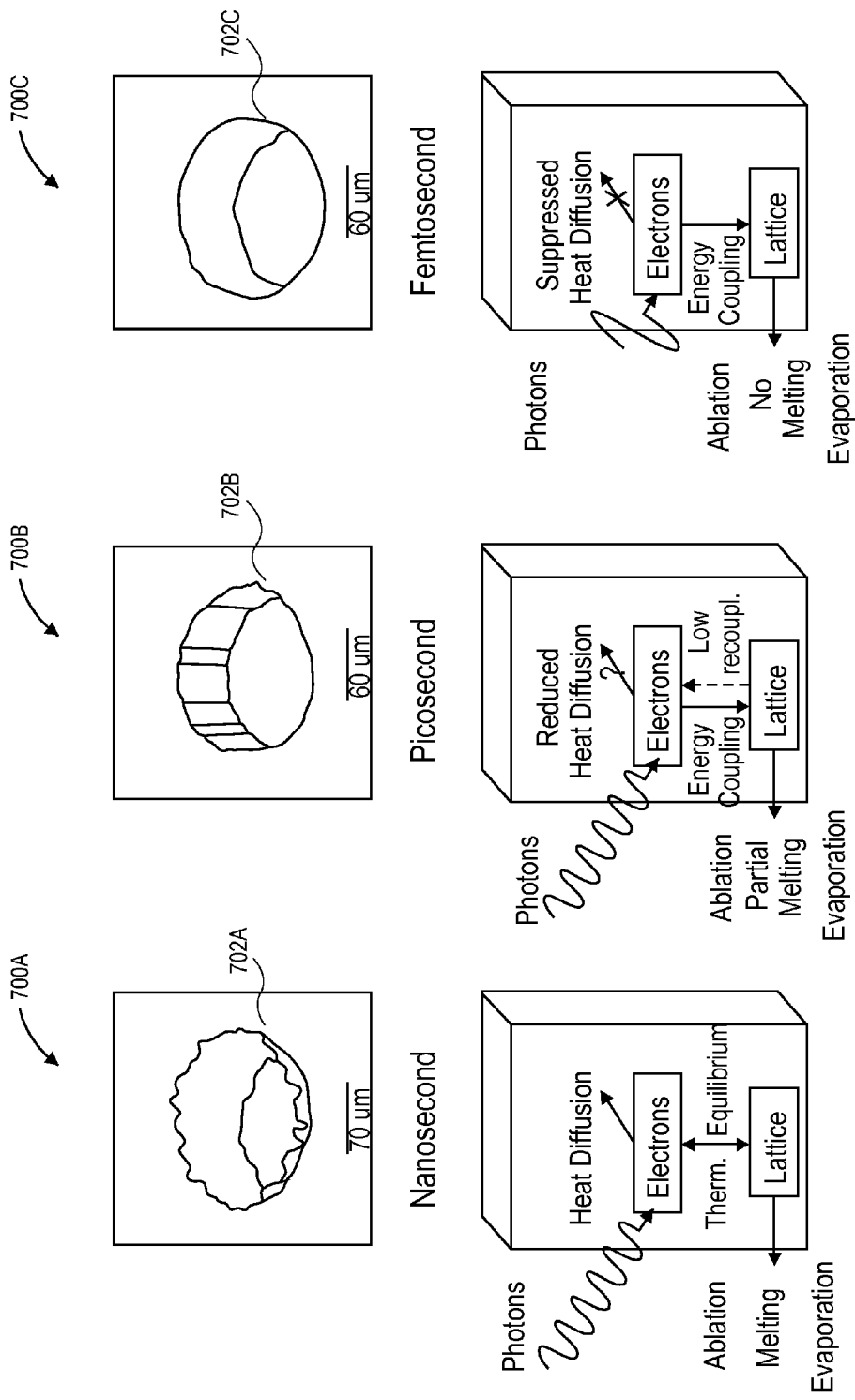
FIG. 7 illustrates the effects of using a laser pulse in the femtosecond range versus longer pulse times, in accordance with an embodiment of the present invention.

FIG. 7 illustrates the effects of using a laser pulse in the femtosecond range versus longer frequencies, in accordance with an embodiment of the present invention. Referring to FIG. 7, by using a laser with a pulse width in the femtosecond range heat damage issues are mitigated or eliminated (e.g., minimal to no damage 702C with femtosecond processing of a via 700C) versus longer pulse widths (e.g., damage 702B with picosecond processing of a via 700B and significant damage 702A with nanosecond processing of a via 700A). The elimination or mitigation of damage during formation of via 700C may be due to a lack of low energy recoupling (as is seen for picosecond-based laser ablation) or thermal equilibrium (as is seen for nanosecond-based laser ablation), as depicted in FIG. 7.

Laser parameters selection, such as pulse width, may be critical to developing a successful laser scribing and dicing process that minimizes chipping, microcracks and delamination in order to achieve clean laser scribe cuts. The cleaner the laser scribe cut, the smoother an etch process that may be performed for ultimate die singulation. In semiconductor device wafers, many functional layers of different material types (e.g., conductors, insulators, semiconductors) and thicknesses are typically disposed thereon. Such materials may include, but are not limited to, organic materials such as polymers, metals, or inorganic dielectrics such as silicon dioxide and silicon nitride.

A street between individual integrated circuits disposed on a wafer or substrate may include the similar or same layers as the integrated circuits themselves. For example, FIG. 8 illustrates a cross-sectional view of a stack of materials that may be used in a street region of a semiconductor wafer or substrate, in accordance with an embodiment of the present invention.

Figure 8:
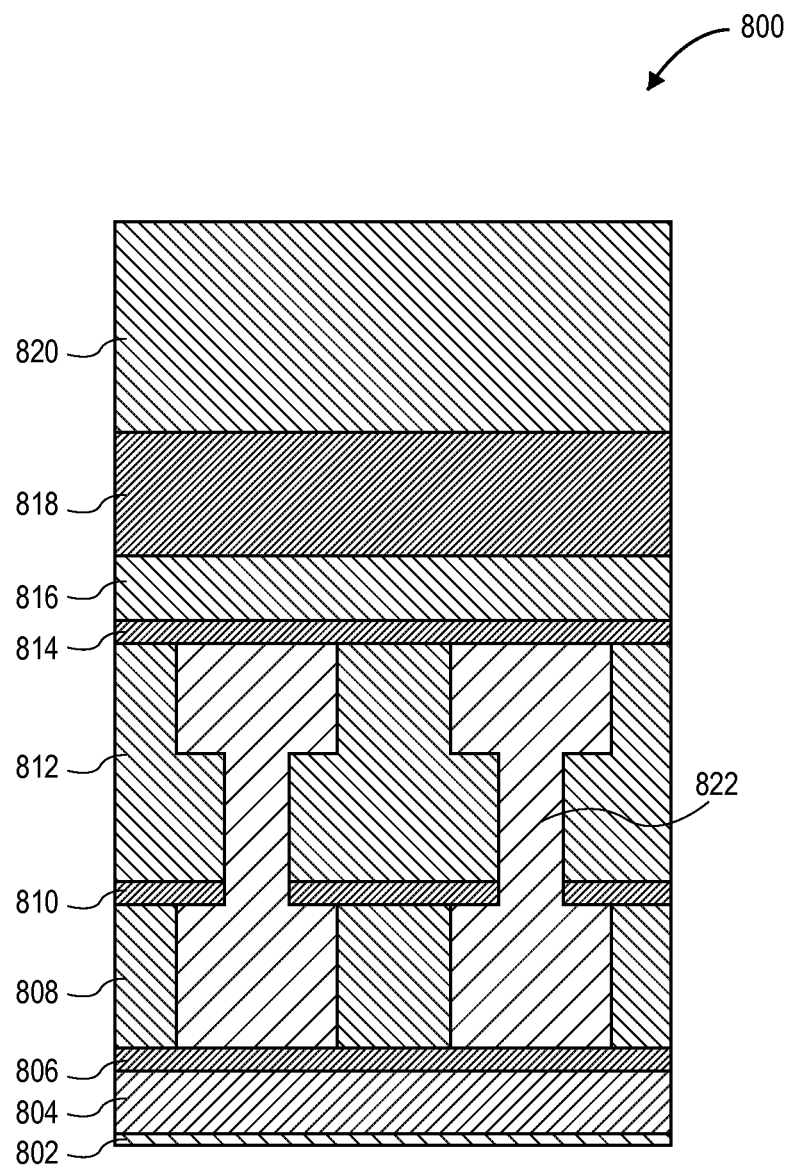
FIG. 8 illustrates a cross-sectional view of a stack of materials that may be used in a street region of a semiconductor wafer or substrate, in accordance with an embodiment of the present invention.

Referring to FIG. 8, a street region 800 includes the top portion 802 of a silicon substrate, a first silicon dioxide layer 804, a first etch stop layer 806, a first low K dielectric layer 808 (e.g., having a dielectric constant of less than the dielectric constant of 4.0 for silicon dioxide), a second etch stop layer 810, a second low K dielectric layer 812, a third etch stop layer 814, an undoped silica glass (USG) layer 816, a passivation layer 818, as an exemplary material stack. Referring again to FIG. 8, a very thick molding compound or underfill material layer 820 may be included, as described above. Copper metallization 822 is disposed between the first and third etch stop layers 806 and 814 and through the second etch stop layer 810. In a specific embodiment, the first, second and third etch stop layers 806, 810 and 814 are composed of silicon nitride, while low K dielectric layers 808 and 812 are composed of a carbon-doped silicon oxide material.

Figures 9, 10:
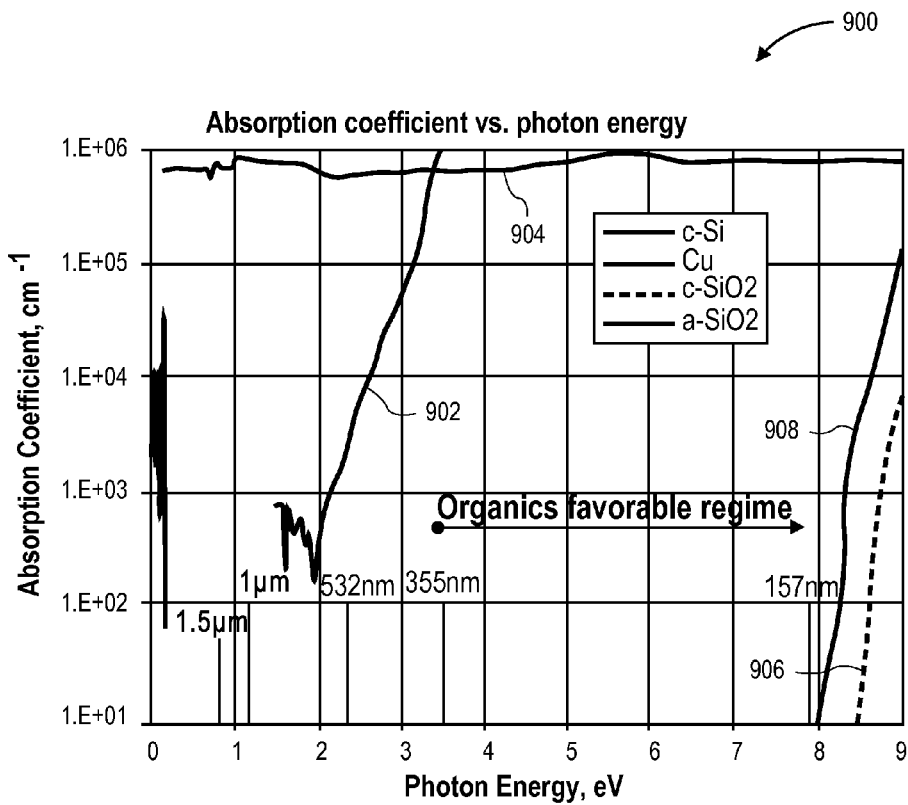
FIG. 9 includes a plot of absorption coefficient as a function of photon energy for crystalline silicon (c-Si), copper (Cu), crystalline silicon dioxide (c-SiO2), and amorphous silicon dioxide (a-SiO2), in accordance with an embodiment of the present invention.
FIG. 10 is an equation showing the relationship of laser intensity for a given laser as a function of laser pulse energy, laser pulse width, and laser beam radius.

Under conventional laser irradiation (such as nanosecond-based or picosecond-based laser irradiation), the materials of street 800 behave quite differently in terms of optical absorption and ablation mechanisms. For example, dielectrics layers such as silicon dioxide, is essentially transparent to all commercially available laser wavelengths under normal conditions. By contrast, metals, organics (e.g., low K materials) and silicon can couple photons very easily, particularly in response to nanosecond-based or picosecond-based laser irradiation. For example, FIG. 9 includes a plot 900 of absorption coefficient as a function of photon energy for crystalline silicon (c-Si, 902), copper (Cu, 904), crystalline silicon dioxide (c-SiO2, 906), and amorphous silicon dioxide (a-SiO2, 908), in accordance with an embodiment of the present invention. FIG. 10 is an equation 1000 showing the relationship of laser intensity for a given laser as a function of laser pulse energy, laser pulse width, and laser beam radius.

Using equation 1000 and the plot 900 of absorption coefficients, in an embodiment, parameters for a femtosecond laser-based process may be selected to have an essentially common ablation effect on the inorganic and organic dielectrics, metals, and semiconductors even though the general energy absorption characteristics of such materials may differ widely under certain conditions. For example, the absorptivity of silicon dioxide is non-linear and may be brought more in-line with that of organic dielectrics, semiconductors and metals under the appropriate laser ablation parameters. In one such embodiment, a high intensity and short pulse width femtosecond-based laser process is used to ablate a stack of layers including a silicon dioxide layer and one or more of an organic dielectric, a semiconductor, or a metal. In a specific embodiment, pulses of approximately less than or equal to 400 femtoseconds are used in a femtosecond-based laser irradiation process to remove a stack including an underfill or molding compound material layer, a street, and a portion of a silicon substrate.

By contrast, if non-optimal laser parameters are selected, in stacked structures that involve two or more of an inorganic dielectric, an organic dielectric, a semiconductor, or a metal, a laser ablation process may cause delamination issues. For example, a laser penetrate through high bandgap energy dielectrics (such as silicon dioxide with an approximately of 9 eV bandgap) without measurable absorption. However, the laser energy may be absorbed in an underlying metal or silicon layer, causing significant vaporization of the metal or silicon layers. The vaporization may generate high pressures to lift-off the overlying silicon dioxide dielectric layer and potentially causing severe interlayer delamination and microcracking. In an embodiment, while picoseconds-based laser irradiation processes lead to microcracking and delaminating in complex stacks, femtosecond-based laser irradiation processes have been demonstrated to not lead to microcracking or delamination of the same material stacks.

In order to be able to directly ablate dielectric layers, ionization of the dielectric materials may need to occur such that they behave similar to a conductive material by strongly absorbing photons. The absorption may block a majority of the laser energy from penetrating through to underlying silicon or metal layers before ultimate ablation of the dielectric layer. In an embodiment, ionization of inorganic dielectrics is feasible when the laser intensity is sufficiently high to initiate photon-ionization and impact ionization in the inorganic dielectric materials.

In accordance with an embodiment of the present invention, suitable femtosecond-based laser processes are characterized by a high peak intensity (irradiance) that usually leads to nonlinear interactions in various materials. In one such embodiment, the femtosecond laser sources have a pulse width approximately in the range of 10 femtoseconds to 500 femtoseconds, although preferably in the range of 100 femtoseconds to 400 femtoseconds. In one embodiment, the femtosecond laser sources have a wavelength approximately in the range of 1570 nanometers to 200 nanometers, although preferably in the range of 540 nanometers to 250 nanometers. In one embodiment, the laser and corresponding optical system provide a focal spot at the work surface approximately in the range of 3 microns to 15 microns, though preferably approximately in the range of 5 microns to 10 microns or between 10-15 microns.

The spacial beam profile at the work surfaces may be a single mode (Gaussian) or have a shaped top-hat profile. In an embodiment, the laser source has a pulse repetition rate approximately in the range of 200 kHz to 10 MHz, although preferably approximately in the range of 500 kHz to 5 MHz. In an embodiment, the laser source delivers pulse energy at the work surface approximately in the range of 0.5 uJ to 100 uJ, although preferably approximately in the range of 1 uJ to 5 uJ. In an embodiment, the laser scribing process runs along a work piece surface at a speed approximately in the range of 500 mm/sec to 5 m/sec, although preferably approximately in the range of 600 mm/sec to 2 m/sec.

The scribing process may be run in single pass only, or in multiple passes, but, in an embodiment, preferably 1-2 passes. The laser may be applied either in a train of single pulses at a given pulse repetition rate or a train of pulse bursts. In an embodiment, the kerf width of the laser beam generated is approximately in the range of 2 microns to 15 microns, although in silicon wafer scribing/dicing preferably approximately in the range of 6 microns to 10 microns, measured at the device/silicon interface.

Laser parameters may be selected with benefits and advantages such as providing sufficiently high laser intensity to achieve ionization of inorganic dielectrics (e.g., silicon dioxide) and to minimize delamination and chipping caused by underlayer damage prior to direct ablation of inorganic dielectrics. Also, parameters may be selected to provide meaningful process throughput for industrial applications with precisely controlled ablation width (e.g., kerf width) and depth. As described above, a femtosecond-based laser is far more suitable to providing such advantages, as compared with picosecond-based and nanosecond-based laser ablation processes. However, even in the spectrum of femtosecond-based laser ablation, certain wavelengths may provide better performance than others. For example, in one embodiment, a femtosecond-based laser process having a wavelength closer to or in the UV range provides a cleaner ablation process than a femtosecond-based laser process having a wavelength closer to or in the IR range. In a specific such embodiment, a femtosecond-based laser process suitable for semiconductor wafer or substrate scribing is based on a laser having a wavelength of approximately less than or equal to 540 nanometers. In a particular such embodiment, pulses of approximately less than or equal to 400 femtoseconds of the laser having the wavelength of approximately less than or equal to 540 nanometers are used. However, in an alternative embodiment, dual laser wavelengths (e.g., a combination of an IR laser and a UV laser) are used.

Referring again to FIGS. 4D and 6D, in an embodiment, etching the semiconductor wafer includes using a plasma etching process. In one embodiment, a through-silicon via type etch process is used. For example, in a specific embodiment, the etch rate of the material of semiconductor wafer (e.g., silicon) is greater than 25 microns per minute. An ultra-high-density plasma source may be used for the plasma etching portion of the die singulation process. An example of a process chamber suitable to perform such a plasma etch process is the Applied Centura® Silvia™ Etch system available from Applied Materials of Sunnyvale, Calif., USA. The Applied Centura® Silvia™ Etch system combines the capacitive and inductive RF coupling, which gives much more independent control of the ion density and ion energy than was possible with the capacitive coupling only, even with the improvements provided by magnetic enhancement. This combination enables effective decoupling of the ion density from ion energy, so as to achieve relatively high density plasmas without the high, potentially damaging, DC bias levels, even at very low pressures. This results in an exceptionally wide process window. However, any plasma etch chamber capable of etching silicon may be used. In an exemplary embodiment, a deep silicon etch is used to etch a single crystalline silicon substrate or wafer at an etch rate greater than approximately 40% of conventional silicon etch rates while maintaining essentially precise profile control and virtually scallop-free sidewalls. In a specific embodiment, a through-silicon via type etch process is used. The etch process is based on a plasma generated from a reactive gas, which generally a fluorine-based gas such as $SF_6$, $C_4F_8$, $CHF_3$, $XeF_2$, or any other reactant gas capable of etching silicon at a relatively fast etch rate. In an embodiment, the subsequent plasma ashing operation to further thin a thick passivation layer is performed in a plasma ash chamber suitable for performing an $O_2$ plasma ash process. In one such embodiment, the chamber is similar to the chamber described for the plasma etch process.

As an additional process operation to FIGS. 4D and 6D, in the case that an initial laser scribe process is used, in accordance with an embodiment of the present invention, an intermediate post laser scribing/pre plasma etching cleaning operation is performed. In an embodiment, the post laser scribing/pre plasma etching cleaning operation is a plasma-based cleaning process. In a first example, as described below, the plasma-based cleaning process is reactive to the regions of the wafer exposed by the laser scribing process. In the case of a reactive plasma-based cleaning process, the cleaning process itself may form or extend trenches in the wafer since the reactive plasma-based cleaning operation is at least somewhat of an etchant for the wafer. In a second, different, example, as is also described below, the plasma-based cleaning process is non-reactive to the regions of the wafer exposed by the laser scribing process.

In accordance with a first embodiment, the plasma-based cleaning process is reactive to exposed regions of the wafer (e.g., a silicon wafer) in that the exposed regions are partially etched during the cleaning process. In one such embodiment, Ar or another non-reactive gas (or the mix) is combined with $SF_6$ for a highly-biased plasma treatment for cleaning of scribed openings. The plasma treatment using mixed gases Ar+$SF_6$ under high-bias power is performed for bombarding mask-opened regions to achieve cleaning of the mask-opened regions. In the reactive breakthrough process, both physical bombardment from Ar and $SF_6$ along with chemical etching due to $SF_6$ and F-ions contribute to cleaning of mask-opened regions. The approach may be suitable for photoresist masks, where breakthrough treatment leads to fairly uniform mask thickness reduction and a gentle Si etch. Such a breakthrough etch process, however, may not be best suited for water soluble mask materials.

In accordance with a second embodiment, the plasma-based cleaning process is non-reactive to exposed regions of the wafer (e.g., a silicon wafer) in that the exposed regions are not or only negligible etched during the cleaning process. In one such embodiment, only non-reactive gas plasma cleaning is used. For example, Ar or another non-reactive gas (or the mix) is used to perform a highly-biased plasma treatment both for mask condensation and cleaning of scribed openings. The approach may be suitable for water-soluble masks. In another such embodiment, separate mask condensation and scribed trench cleaning operations are used, e.g., an Ar or non-reactive gas (or the mix) highly-biased plasma treatment for mask condensation is first performed, and then an Ar+$SF_6$ plasma cleaning of a laser scribed trench is performed. This embodiment may be suitable for cases where Ar-cleaning is not sufficient for trench cleaning due to too thick of a mask material. Cleaning efficiency is improved for thinner masks, but mask etch rate is much lower, with almost no consumption in a subsequent deep silicon etch process. In yet another such embodiment, three-operation cleaning is performed: (a) Ar or non-reactive gas (or the mix) highly-biased plasma treatment for mask condensation, (b) Ar+$SF_6$ highly-biased plasma cleaning of laser scribed trenches, and (c) Ar or non-reactive gas (or the mix) highly-biased plasma treatment for mask condensation. In accordance with another embodiment of the present invention, a plasma cleaning operation involves first use of a reactive plasma cleaning treatment. The reactive plasma cleaning treatment is then followed by a non-reactive plasma cleaning.

Accordingly, referring again to FIGS. 4D and 6D, wafer dicing may be performed by initial laser ablation through wafer streets (including metallization), and partially into a silicon substrate. The laser pulse width may be selected in the femto-second range. Die singulation may then be completed by subsequent through-silicon deep plasma etching. The singulation process may further include patterning a die attach film, exposing a top portion of a backing tape and singulating the die attach film. In an embodiment, the die attach film is singulated by a laser process or by an etch process. Further embodiments may include subsequently removing the singulated portions of substrate (e.g., as individual integrated circuits) from the backing tape. In one embodiment, the singulated die attach film is retained on the back sides of the singulated portions of substrate. In an embodiment, the singulated integrated circuits are removed from the backing tape for packaging. In one such embodiment, a patterned die attach film is retained on the backside of each integrated circuit and included in the final packaging. However, in another embodiment, the patterned die attach film is removed during or subsequent to the singulation process.

A single process tool may be configured to perform many or all of the operations in a hybrid laser ablation and plasma etch singulation process. For example, FIG. 11 illustrates a block diagram of a tool layout for laser and plasma dicing of wafers or substrates, in accordance with an embodiment of the present invention.

Figure 11:
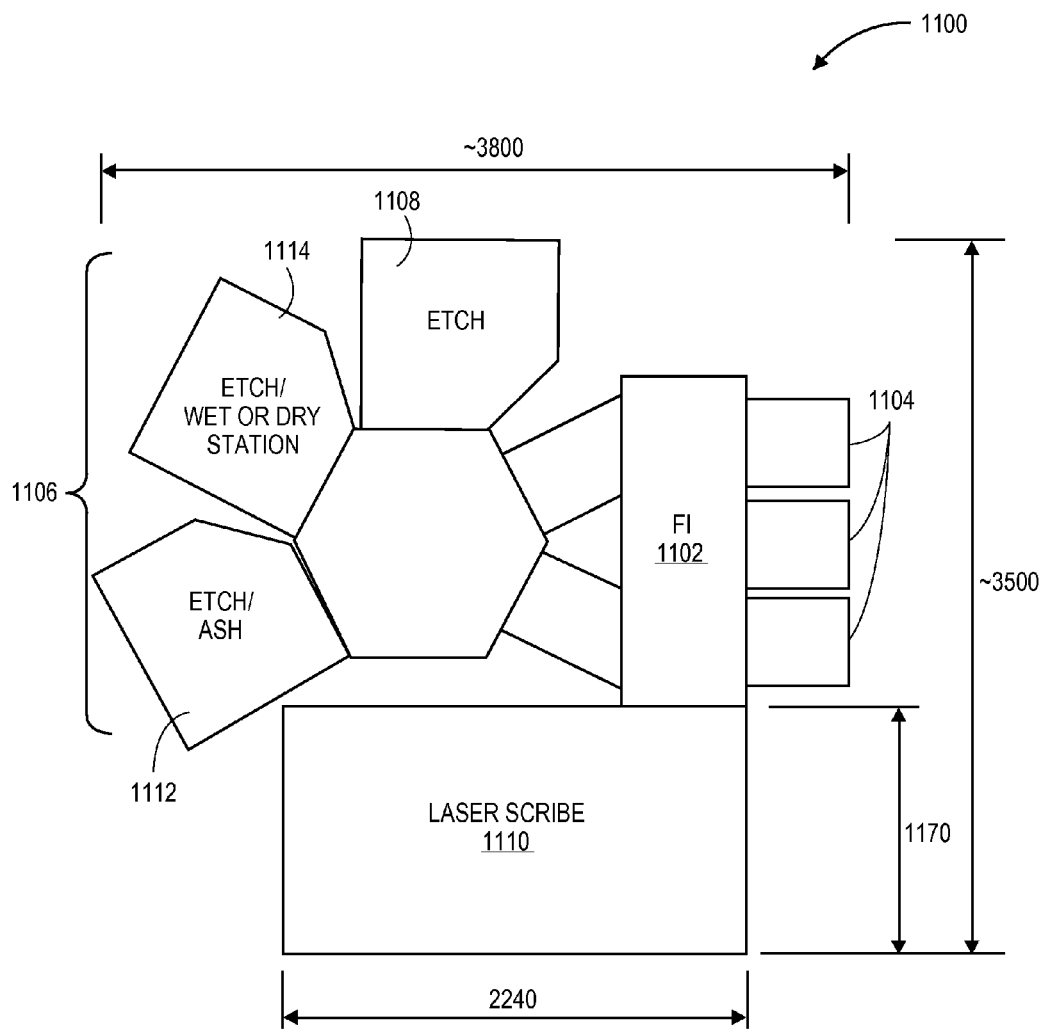
FIG. 11 illustrates a block diagram of a tool layout for laser and plasma dicing of wafers or substrates, in accordance with an embodiment of the present invention.

Referring to FIG. 11, a process tool 1100 includes a factory interface 1102 (FI) having a plurality of load locks 1104 coupled therewith. A cluster tool 1106 is coupled with the factory interface 1102. The cluster tool 1106 includes one or more plasma etch chambers, such as plasma etch chamber 1108. A laser scribe apparatus 1110 is also coupled to the factory interface 1102. The overall footprint of the process tool 1100 may be, in one embodiment, approximately 3500 millimeters (3.5 meters) by approximately 3800 millimeters (3.8 meters), as depicted in FIG. 11.

In an embodiment, the laser scribe apparatus 1110 houses a femto-second-based laser. The femtosecond-based laser is suitable for performing a laser ablation portion of a hybrid laser and etch singulation process, such as the laser ablation processes described above. In one embodiment, a moveable stage is also included in laser scribe apparatus 1100, the moveable stage configured for moving a wafer or substrate (or a carrier thereof) relative to the femtosecond-based laser. In a specific embodiment, the femtosecond-based laser is also moveable. The overall footprint of the laser scribe apparatus 1110 may be, in one embodiment, approximately 2240 millimeters by approximately 1270 millimeters, as depicted in FIG. 11. It is to be understood, however, in other embodiments, a nano- or pico-second based laser is used.

In an embodiment, the one or more plasma etch chambers 1108 is configured for etching a wafer or substrate through the gaps in a pre-patterned mask to singulate a plurality of integrated circuits. In one such embodiment, the one or more plasma etch chambers 1108 is configured to perform a deep silicon etch process. In a specific embodiment, the one or more plasma etch chambers 1108 is an Applied Centura® Silvia™ Etch system, available from Applied Materials of Sunnyvale, Calif., USA. The etch chamber may be specifically designed for a deep silicon etch used to create singulate integrated circuits housed on or in single crystalline silicon substrates or wafers. In an embodiment, a high-density plasma source is included in the plasma etch chamber 1108 to facilitate high silicon etch rates. In an embodiment, more than one etch chamber is included in the cluster tool 1106 portion of process tool 1100 to enable high manufacturing throughput of the singulation or dicing process, e.g., the inclusion of additional etch chamber 1112 and, possibly, 1114.

The factory interface 1102 may be a suitable atmospheric port to interface between an outside manufacturing facility with laser scribe apparatus 1110 and cluster tool 1106. The factory interface 1102 may include robots with arms or blades for transferring wafers (or carriers thereof) from storage units (such as front opening unified pods) into either cluster tool 1106 or laser scribe apparatus 1110, or both.

Cluster tool 906 may include other chambers suitable for performing functions in a method of singulation. For example, in one embodiment, in place of an additional etch chamber, a wet/dry station 1114 is included. The wet/dry station may be suitable for cleaning residues and fragments (and, possibly, for mask removal) subsequent to a laser scribe and plasma etch/ash singulation process of a substrate or wafer. In an embodiment, a metrology station is also included as a component of process tool 1100.

Embodiments of the present invention may be provided as a computer program product, or software, that may include a machine-readable medium having stored thereon instructions, which may be used to program a computer system (or other electronic devices) to perform a process according to embodiments of the present invention. In one embodiment, the computer system is coupled with process tool 1100 described in association with FIG. 11. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 12:
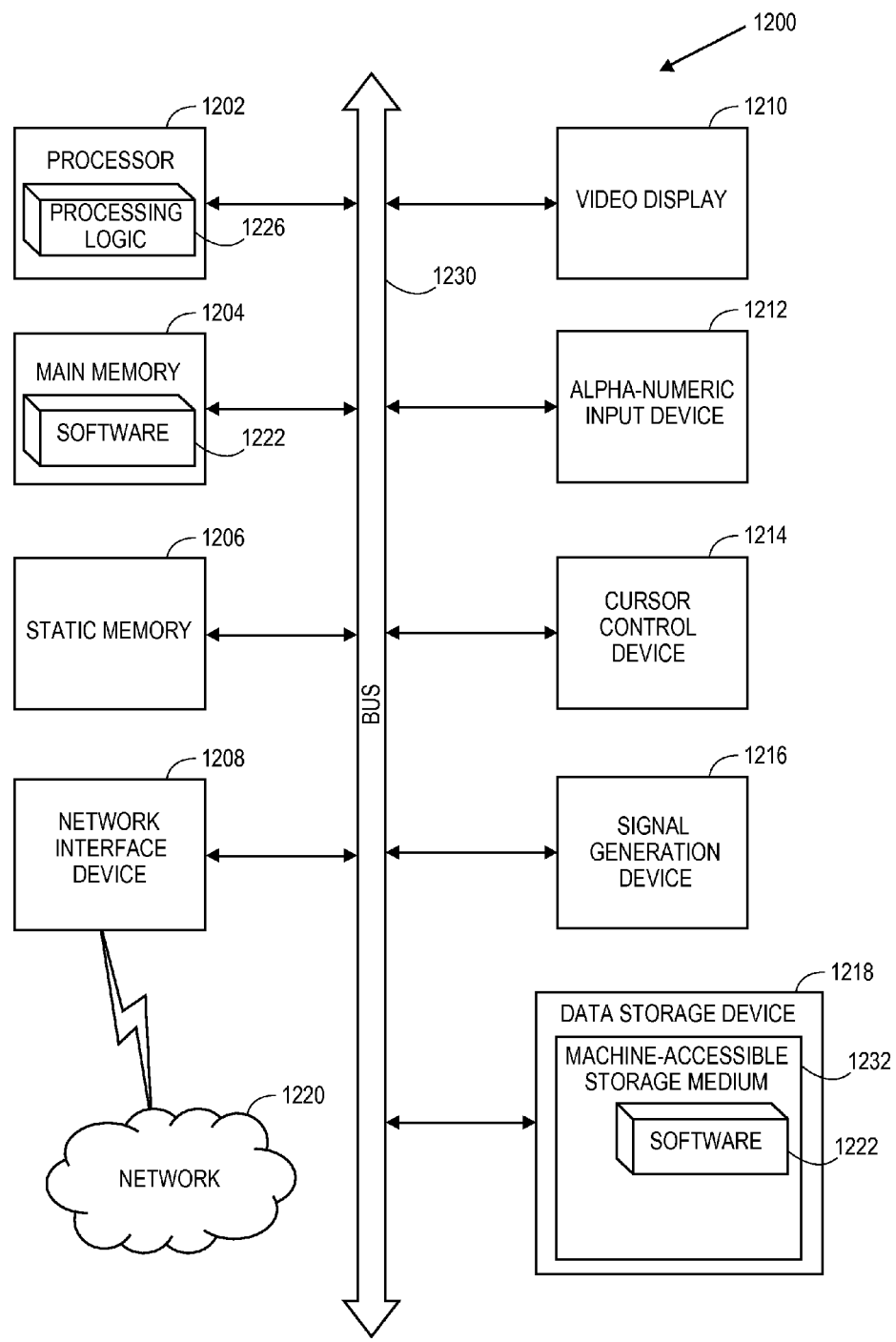
FIG. 12 illustrates a block diagram of an exemplary computer system, in accordance with an embodiment of the present invention.

FIG. 12 illustrates a diagrammatic representation of a machine in the exemplary form of a computer system 1200 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 1200 includes a processor 1202, a main memory 1204 (e.g., read-only memory (ROM), flash memory, dynamic random access memory (DRAM) such as synchronous DRAM (SDRAM) or Rambus DRAM (RDRAM), etc.), a static memory 1206 (e.g., flash memory, static random access memory (SRAM), etc.), and a secondary memory 1218 (e.g., a data storage device), which communicate with each other via a bus 1230.

Processor 1202 represents one or more general-purpose processing devices such as a microprocessor, central processing unit, or the like. More particularly, the processor 1202 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 1202 may also be one or more special-purpose processing devices such as an application specific integrated circuit (ASIC), a field programmable gate array (FPGA), a digital signal processor (DSP), network processor, or the like. Processor 1202 is configured to execute the processing logic 1226 for performing the operations described herein.

The computer system 1200 may further include a network interface device 1208. The computer system 1200 also may include a video display unit 1210 (e.g., a liquid crystal display (LCD), a light emitting diode display (LED), or a cathode ray tube (CRT)), an alphanumeric input device 1212 (e.g., a keyboard), a cursor control device 1214 (e.g., a mouse), and a signal generation device 1216 (e.g., a speaker).

The secondary memory 1218 may include a machine-accessible storage medium (or more specifically a computer-readable storage medium) 1232 on which is stored one or more sets of instructions (e.g., software 1222) embodying any one or more of the methodologies or functions described herein. The software 1222 may also reside, completely or at least partially, within the main memory 1204 and/or within the processor 1202 during execution thereof by the computer system 1200, the main memory 1204 and the processor 1202 also constituting machine-readable storage media. The software 1222 may further be transmitted or received over a network 1220 via the network interface device 1208.

While the machine-accessible storage medium 1232 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

In accordance with an embodiment of the present invention, a machine-accessible storage medium has instructions stored thereon which cause a data processing system to perform a method of dicing a semiconductor wafer with a front surface having a plurality of integrated circuits thereon. The method involves laminating a pre-patterned mask on the front surface of the semiconductor wafer. The pre-patterned mask covers the integrated circuits and exposes streets between the integrated circuits. The method also involves plasma etching the semiconductor wafer through the streets to singulate the integrated circuits. The pre-patterned mask protects the integrated circuits during the plasma etching.

Thus, approaches for protecting a wafer during plasma etching wafer dicing processes have been disclosed.

What is claimed is:

1. A method of dicing a semiconductor wafer comprising a front surface having a plurality of integrated circuits thereon, the method comprising:
    laminating a pre-patterned mask on the front surface of the semiconductor wafer, the pre-patterned mask covering the integrated circuits and exposing streets between the integrated circuits, wherein laminating the pre-patterned mask comprises using a reel-to-reel carrier film that supports the pre-patterned mask and releasing the carrier film subsequent to adhering the pre-patterned mask on the front surface of the semiconductor wafer; and
    plasma etching the semiconductor wafer through the streets to singulate the integrated circuits, wherein the pre-patterned mask protects the integrated circuits during the plasma etching.

2. The method of claim 1, wherein laminating the pre-patterned mask comprises laminating a dry laminate pre-patterned mask.

3. The method of claim 1, wherein the carrier film comprises polyethylene terephthalate (PET), and wherein adhering the pre-patterned mask on the front surface of the semiconductor wafer comprises vacuum laminating the pre-patterned mask on the front surface of the semiconductor wafer.

4. The method of claim 1, further comprising:
    subsequent to plasma etching the semiconductor wafer through the streets, removing the pre-patterned mask.

5. The method of claim 1, wherein the pre-patterned mask comprises a water-soluble material, and wherein removing the pre-patterned mask comprises using an aqueous-based treatment.

6. A method of dicing a semiconductor wafer comprising a front surface having a plurality of integrated circuits thereon, the method comprising:
    laminating a pre-patterned mask on the front surface of the semiconductor wafer, the pre-patterned mask covering the integrated circuits and exposing streets between the integrated circuits, wherein laminating the pre-patterned mask comprises using a reel-to-reel carrier film that supports the pre-patterned mask and releasing the carrier film subsequent to adhering the pre-patterned mask on the front surface of the semiconductor wafer;
    laser scribing the streets to provide scribe lines between the integrated circuits; and
    plasma etching the semiconductor wafer through the scribe lines to singulate the integrated circuits, wherein the pre-patterned mask protects the integrated circuits during the plasma etching.

7. The method of claim 6, wherein laser scribing the streets comprises laser scribing one or more of a passivation layer, an underfill material layer, or a molding compound layer formed above the semiconductor wafer.

8. The method of claim 7, wherein laser scribing the streets further comprises forming trenches in the semiconductor wafer, between the integrated circuits, and wherein plasma etching the semiconductor wafer through the scribe lines comprises forming trench extensions corresponding to the trenches.

9. The method of claim 6, wherein laser scribing the streets comprises laser scribing only a portion of a device layer of the semiconductor wafer.

10. The method of claim 6, wherein laser scribing the streets comprises using a femto-second-based laser scribing process.

11. The method of claim 6, wherein laminating the pre-patterned mask comprises laminating a dry laminate pre-patterned mask.

12. The method of claim 6, wherein the carrier film comprises polyethylene terephthalate (PET), and wherein adhering the pre-patterned mask on the front surface of the semiconductor wafer comprises vacuum laminating the pre-patterned mask on the front surface of the semiconductor wafer.

13. The method of claim 6, further comprising:
    subsequent to plasma etching the semiconductor wafer through the streets, removing the pre-patterned mask.

14. The method of claim 6, wherein the pre-patterned mask comprises a water-soluble material, and wherein removing the pre-patterned mask comprises using an aqueous-based treatment.

15. A method of dicing a semiconductor wafer comprising a front surface having a plurality of integrated circuits thereon, the method comprising:
    forming a pre-patterned underfill material layer between and covering metal pillar/solder bump pairs of the integrated circuits, the pre-patterned underfill material layer exposing streets between the integrated circuits;
    plasma etching the semiconductor wafer through the streets to singulate the integrated circuits, wherein the pre-patterned underfill material layer protects the integrated circuits during the plasma etching; and
    subsequent to the plasma etching, thinning but not removing the pre-patterned underfill material layer to partially expose the metal pillar/solder bump pairs of the integrated circuits.

16. The method of claim 15, further comprising:
    prior to plasma etching the semiconductor wafer through the streets, laser scribing the streets to provide scribe lines between the integrated circuits, wherein plasma etching the semiconductor wafer through the streets comprises plasma etching the semiconductor wafer through the scribe lines.

17. The method of claim 15, wherein laminating the pre-patterned underfill material layer comprises laminating a dry laminate pre-patterned underfill material layer.

18. The method of claim 15, wherein laminating the pre-patterned underfill material layer comprises using a reel-to-reel carrier film that supports the pre-patterned underfill material layer, and releasing the carrier film subsequent to adhering the pre-patterned underfill material layer to the front surface of the semiconductor wafer.

19. The method of claim 18, wherein the carrier film comprises polyethylene terephthalate (PET), and wherein adhering the pre-patterned underfill material layer to the front surface of the semiconductor wafer comprises vacuum laminating the pre-patterned underfill material layer to the front surface of the semiconductor wafer.

\* \* \* \* \*